United States Patent
Sato et al.

(10) Patent No.: US 6,974,974 B2
(45) Date of Patent: *Dec. 13, 2005

(54) LIGHT EMITTING DEVICES WITH LAYERED III-V SEMICONDUCTOR STRUCTURES, AND MODULES AND SYSTEMS FOR COMPUTER, NETWORK AND OPTICAL COMMUNICATION, USING SUCH DEVICES

(75) Inventors: Shunichi Sato, Naka-Machi (JP); Takashi Takahashi, Sendai (JP); Naoto Jikutani, Sendai (JP)

(73) Assignee: Ricoh Company, Ltd., Tokyo (JP)

(*) Notice: Subject to any disclaimer, the term of this patent is extended or adjusted under 35 U.S.C. 154(b) by 44 days.

This patent is subject to a terminal disclaimer.

(21) Appl. No.: 10/646,438

(22) Filed: Aug. 22, 2003

(65) Prior Publication Data

US 2004/0065887 A1 Apr. 8, 2004

Related U.S. Application Data

(60) Division of application No. 09/735,226, filed on Dec. 12, 2000, now Pat. No. 6,657,233, which is a continuation-in-part of application No. 09/376,018, filed on Aug. 19, 1999, now Pat. No. 6,207,973.

(30) Foreign Application Priority Data

| Aug. 19, 1998 | (JP) | 10-249185 |
| Sep. 22, 1998 | (JP) | 10-286056 |
| Nov. 9, 1998 | (JP) | 10-333451 |
| Mar. 18, 1999 | (JP) | 11-073497 |

(51) Int. Cl.[7] .............................................. H01L 27/15

(52) U.S. Cl. ............................. 257/79; 257/86; 257/87; 257/94; 257/103

(58) Field of Search ................................... 257/79–103

(56) References Cited

U.S. PATENT DOCUMENTS

| 5,036,022 A | 7/1991 | Kuech et al. |
| 5,253,264 A | 10/1993 | Suzuki et al. |
| 6,207,973 B1 * | 3/2001 | Sato et al. ........... 257/98 |

FOREIGN PATENT DOCUMENTS

| JP | 6-37355 | 2/1994 |
| JP | 6275914 | 9/1994 |
| JP | 6334168 | 12/1994 |
| JP | 7154023 | 6/1995 |
| JP | 7193327 | 7/1995 |
| JP | 8195522 | 7/1996 |
| JP | 9237942 | 9/1997 |
| JP | 9283857 | 10/1997 |
| JP | 10074979 | 3/1998 |
| JP | 10126004 | 5/1998 |
| JP | 10126005 | 5/1998 |

* cited by examiner

Primary Examiner—Long Pham
Assistant Examiner—Wai-Sing Louie
(74) Attorney, Agent, or Firm—Cooper & Dunham LLP

(57) ABSTRACT

A semiconductor light emitting device is disclosed, including a semiconductor substrate, an active region comprising a strained quantum well layer, and a cladding layer for confining carriers and light emissions, wherein the amount of lattice strains in the quantum well layer is in excess of 2% against either the semiconductor substrate or cladding layer and, alternately, the thickness of the quantum well layer is in excess of the critical thickness calculated after Matthews and Blakeslee.

51 Claims, 17 Drawing Sheets

LIGHT EMITTING DEVICES WITH LAYERED III-V SEMICONDUCTOR STRUCTURES, AND MODULES AND SYSTEMS FOR COMPUTER, NETWORK AND OPTICAL COMMUNICATION, USING SUCH DEVICES

CONTINUING DATA

This application is a divisional of U.S. Ser. No. 09/735,226, filed Dec. 12, 2000 now U.S. Pat. No. 6,657,233, which is a continuation-in-part of application Ser. No. 09/376,018, filed Aug. 19, 1999 (now U.S. Pat. No. 6,207,973), the entire contents of which are herein incorporated by reference.

BACKGROUND

1. Field

This specification relates to layered semiconductor structures and more particularly, to light emitting devices incorporating layered III–V alloy semiconductor structures for use in durable laser diodes having light emissions of longer wavelengths, and apparatus and system using such light emitting devices.

2. Description of the Related Art

As communication systems have developed and both desired and current information transmission rates have increased, more attention has been focused on the development of optical communication systems.

As presently contemplated, the optical communication system presently used in main communication lines will be extended to each subscriber's domestic line. To implement such systems, it is indispensable to develop smaller and less expensive optical devices such as, among others, light emitting devices like laser diodes and light emitting diodes and photoreceptors.

Light emitting devices such as laser diodes are conventionally accompanied by a cooling device such as a peltier element or heat sink so as to control the change in device temperature caused by input current. However, it would be highly desirable to provide stable laser diodes which do not need cooling devices, in order to widely implement light emitting devices in the communication system.

To achieve stable operation of the laser diodes at practical operation temperatures, it is desirable that these devices have improved device capabilities such as relatively low threshold current density and reduced temperature variation in device characteristics.

When a layer of semiconductor is formed on a semiconductor substrate having lattice constants different from each other, it is known that the former can generally be grown with satisfactory crystalline quality up to the critical thickness, which is the thickness above which undesirable strain-induced dislocation appears. This critical thickness may be calculated from the magnitude of strains induced by the difference in lattice constants of these semiconductor materials.

However, in the previous semiconductor alloy systems such as, for example, the combination of GaInPAs as the layer material and InP as the substrate (or GaInPAs/InP), there has been found no appropriate combination to attain a desirable magnitude of the conduction band discontinuity, thereby leading to difficulty in attaining satisfactory high temperature device characteristics.

Several semiconductor laser diodes have been proposed to improve temperature characteristics.

As an example, a ternary GaInAs substrate is disclosed to grow active layers thereon, of a semiconductor light emitting device in Japanese Laid-Open Patent Application No. 6-275914. Since the substrate is composed of GaInAs, on which a semiconductor material may be grown having a wider band gap energy, this may lead to the formation of a desirable magnitude of the conduction band discontinuity, which has not been achieved previously by the InP substrate.

As another example, a semiconductor laser device on a GaAs substrate is disclosed in Japanese Laid-Open Patent Application No. 7-193327 to attain long wavelength emissions. The laser device comprises a GaAs substrate, on which are grown a GaInAs buffer layer for relaxing the lattice with a lattice constant larger than the substrate and active layers further thereon.

Since a semiconductor layer is grown on the GaInAs substrate, having a lattice constant larger than that on the GaAs substrate, a larger value of the conduction band discontinuity may be attained similarly to the above-mentioned light emitting device disclosed in the '914 patent Application.

In addition, a semiconductor layer can be grown on a GaAs substrate, having a band gap energy larger than that on other substrates such as those composed of InP and ternary GaInAs.

However, in the previous semiconductor alloy systems, there has been found no such semiconductor material serving as an active region which has a band gap energy corresponding to longer wavelength emissions such as, for example, the 1.3 micron region. Namely, when the GaInAs layer is grown on the GaAs substrate, the emission wavelength from the GaInAs layer increases with the increase in the In content. However, this increase in In content leads to an increase in the amount of lattice strains. In addition, since the critical value of lattice strains is approximately 2%, it has been suggested that this value yields a limit to the emission wavelength to approximately 1.1 micron according to IEEE Photonics Technol. Lett. Vol. 9, pages 1319–1321 (1997). Photo-emission for the material, which is grown at 400° C. by molecular beam epitaxy (MBE) method, is observed at the wavelength of 1.223 micron (Journal of Applied Physics, Vol. 78, pages 1685–8 (1995)). This material, however, has not been used in a practical semiconductor laser device.

A further laser diode comprising a GaInNAs active layer formed on a GaAs substrate has been disclosed in Japanese Laid-Open Patent Application No. 6-37355. In that disclosure, GaInAs layers, which have a lattice constant larger than that of GaAs, are added with nitrogen (N) to thereby form GaInNAs layers having a decreased lattice constant, to thereby be lattice-matched to GaAs.

In addition, since N has an electronegativity larger than other elements, band gap energy of the GaInNAs layers further decreases. As a result, light emissions at the wavelength region of 1.3 μm or 1.5 μm have become feasible in these devices.

As another example, calculated results on the energy level line-up are described by Kondow et al. in Japanese Journal of Applied Physics, Vol. 35, pages 1273–5 (1996), for a laser diode comprising a GaInNAs active layer formed on a GaAs substrate.

It is described in this publication that, since the GaInNAs system is lattice-matched to GaAs, cladding layers may be provided which are composed of AlGaAs, which has a larger band gap energy, in place of the materials which are lattice-matched to GaAs. In addition, by the addition of N, the energy levels of both valence and conduction bands decrease as well as the band gap energy for the hetero-junction which is formed between the GaInNAs active layer and cladding layer. Therefore, a large value of the conduction band discontinuity may be attained. This allows fabrication of laser diodes having improved temperature characteristics.

Also, in order to attain conduction band discontinuity with an appropriate magnitude to prevent the overflow of carriers and satisfactory high temperature characteristics of long wavelength lasers in a similar manner to GaInNAs formed on GaAs, InNPAs layers formed on InP substrates have been disclosed, including one by the inventor in Japanese Laid-Open Patent Application No. 10-126005, and another in Japanese Laid-Open Patent Application No. 9-219563.

Other examples have also been disclosed on GaInNAs laser structures, including edge emitting laser structures in Japanese Laid-Open Patent Applications No. 8-195522 and 10-126004, and surface emission type devices in No. 9-237942 and 10-74979.

Several 1.3 micron range GaInNAs lasers have been fabricated recently, such as one incorporating a double-hetero structure comprising a thick GaInNAs active layer formed on, and lattice-matched to, a GaAs substrate with 3% of N and 10% of In, according to Electron Lett. Vol. 33 pages 1386–71 (1997); and the other incorporating a compressedly strained GaInNAs single quantum well structure with 1% of N and 30% of In according to IEEE Photonics Technol. Lett. Vol. 10 pages 487–88 (1998). A laser emission is observed at the wavelength of 1.1168 micron for the latter material, which has 30% of In with no N and which is incorporated into a quantum well structure having a well thickness of 7 nm. This emission has the longest wavelength, to our knowledge, which is observed at room temperature for the compressive strained GaInAs quantum well active layer grown on the GaAs substrate.

However, some of the materials and systems described above have several shortcomings which follow. Namely, the ternary GaInAs substrate disclosed in the Application '914 is difficult to form, the laser structure incorporating the GaInNAs buffer layer disclosed in the Application '327 has a shortcoming in its durability, and the III–V alloy system which includes N or other group-V element, such as GaInNAs, tends to grow having a resulting crystallinity considerably degraded with the increase in N content.

As for the methods of growing a III–V semiconductor alloy layer, which includes N and other group-V elements, there are found several disclosures including the metal organic chemical vapor deposition (MOCVD) method disclosed in Japanese Laid-Open Patent Application No. 6-37355, the MOCVD method using dimethylhydrazine as the N source disclosed in Japanese Laid-Open Patent Applications No. 7-154023 and 9-283857, and the MBE method using active N species disclosed in Japanese Laid-Open Patent Applications No. 6-334168.

In these growth methods, however, there have been realized several shortcomings such as, among others, difficulties in incorporating an appropriate amount of N into the III–V semiconductor alloy layers because of a small rate of the N inclusion into the layers during the layer growth.

SUMMARY OF THE DISCLOSURE

Accordingly, it is an object of the present disclosure to provide improved layered semiconductor structures, light emitting semiconductor devices using the layered structures, and methods of growing the layered structures, having most, if not all, of the advantages and features of similar employed structures and devices, while eliminating many of the aforementioned disadvantages.

It is another object of the present disclosure to provide a semiconductor light emitting device comprising a semiconductor substrate, an active region comprising a strained quantum well layer, and a cladding layer for confining carriers and light emissions, wherein the amount of lattice strains in the quantum well layer is in excess of 2% against either the semiconductor substrate or cladding layer. Alternately, the thickness of the quantum well layer may be in excess of the critical thickness calculated by the relationship of Matthews and Blakeslee.

It is still another object of the present disclosure to provide a semiconductor light emitting device, comprising an active region comprising a strained quantum well layer, wherein the strained quantum well layer is composed of $Ga_xIn_{1-x}N_yAs_{1-y}$ ($0 \leq x \leq 1$, $0 \leq y < 1$), characterized to have a photoluminescence peak wavelength of at least 1.12 micron for GaInAs (y=0).

It is another object of the present disclosure to provide a semiconductor light emitting device, comprising a semiconductor substrate, and an active region comprising a strained quantum well layer, wherein the In content in the strained quantum well layer is at least 30% of group-III elements included therein, the N content in the strained quantum well layer is from 0% to 1% of group-V elements included therein, and the plane orientation of the GaAs substrate is in the (100) direction with the allowable deviation of at most 5°.

It is still another object of the present disclosure to provide a semiconductor light emitting device of the surface emitting device type, comprising an active region comprising a strained quantum well layer, further comprising a first mirror region formed adjacent to the semiconductor substrate, the quantum well active region formed thereon, comprising the strained quantum well layer; and a second mirror region formed on the opposite side of the active region from first mirror region, to collectively constitute an optical cavity for achieving stimulated light emissions, wherein at least the first mirror region is constructed to have a periodic multi-layered structure of thin semiconductor layers with alternating higher and lower refractive indices. The thin semiconductor layers may alternately formed so as to contain no Al.

It is still another object of the present disclosure to provide a semiconductor light emitting device of the surface emitting device type, in a similar manner to the device above, with the exception that at least the first mirror region is constructed to have a periodic multi-layered structure of thin dielectric layers with alternating higher and lower refractive indices.

It is another object of the present disclosure to provide a method of fabricating semiconductor light emitting device comprising III–V alloy semiconductor layers formed on a semiconductor substrate, such as an active region comprising a strained quantum well layer, and a cladding layer for confining carriers and light emissions. The method comprises the step of forming the III–V alloy semiconductor layers by metal organic chemical vapor deposition (MOCVD) preferably at temperatures of at most 600° C.

It is another object of the present disclosure to provide a method of fabricating semiconductor light emitting device comprising III–V alloy semiconductor layers formed on a semiconductor substrate, wherein the strained quantum well layer is composed of $Ga_xIn_{1-x}N_yAs_{1-y}$ ($0 \leq x \leq 1$, $0 \leq y < 1$), and at least one $Ga_xIn_{1-x}N_yAs_{1-y}$ ($0 \leq x \leq 1$, $0 \leq y < 1$) strained quantum well layer is formed using nitrogen containing organic compounds selected from the group consisting of dimethylhydrazine and monomethylhydrazine.

In addition to the above-mentioned methods of improving the crystalline quality considering primarily the degree of lattice strains and critical thickness, the crystalline quality can also be improved by including a small amount of Al.

It is therefore another object to disclose a method of forming a III–V semiconductor alloy containing at least Al as one group-III element and both N and As as group-V elements, comprising the step of depositing the III–V alloy semiconductor layers by metal organic chemical vapor deposition (MOCVD) using organometallic compounds selected from the group consisting of trimethylaluminum and triethylaluminum, as the Al source.

Since the present method also facilitates the layer growth to possibly be carried out under a wider range of conditions to be optimized for the layer growth, such as, for example, the growth temperature and feeding rate of source gasses, to thereby be able to attain satisfactory crystalline quality for light emissions.

With the present structure of layered III–V alloy semiconductor, a conduction band discontinuity may be formed with sufficient magnitude for preventing overflow of injected carriers. This yields the fabrication of laser diodes having improved temperature characteristics, which is useful for fabricating durable laser diodes with longer emission wavelengths.

As a result, light emissions at the wavelength region of 1.3 $\mu$m, 1.5 $\mu$m and possibly longer become feasible. Light emitting devices such as, for example, edge emitting laser and VCSEL devices may therefore be fabricated with improved emission efficiency and other device characteristics. With the fabrication methods disclosed herein, semiconductor light emitting devices can suitably be provided for long wavelength range laser emissions with excellent device characteristics and improved crystalline properties. In addition, utilizing the thus prepared semiconductor light emitting devices, apparatuses and systems suitable for use in the optical communication can be provided.

BRIEF DESCRIPTION OF THE DRAWINGS

The invention together with its various features and advantages, can be more easily understood from the following more detailed description taken in conjunction with the accompanying drawing in which.

DESCRIPTION OF THE ILLUSTRATIVE EMBODIMENTS

In the description which follows, specific embodiments of the invention particularly useful in light emitting device applications are described. It is understood, however, that the invention is not limited to these embodiments. For example, it is appreciated that layered structures disclosed herein are adaptable to any form of semiconductor devices. Other embodiments will be apparent to those skilled in the art.

As described earlier, there have been realized several difficulties in known layer growth methods such as, for example, the control of the amount of lattice strains when increasing the content of In in the quantum well layer, which makes it difficult to attain satisfactory crystalline quality for long wavelength light emissions.

In the present disclosure, an improved method will be disclosed wherein the growth of GaInAs quantum well layer on GaAs is feasible having excellent crystalline quality. This may lead to the wavelength of laser emissions exceeding 1.2 micron which has been considered to be the limiting value for known devices.

Figure 1:
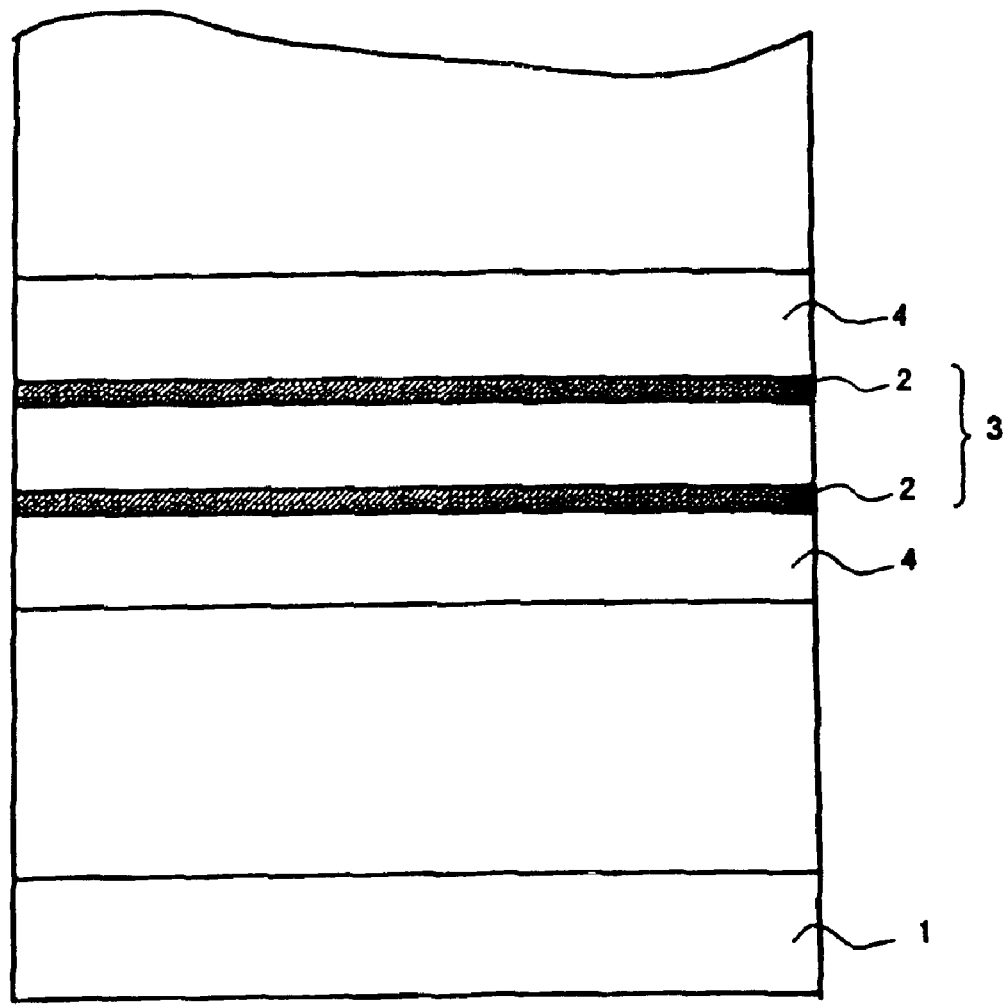
FIG. 1 is a cross sectional view of an illustrative embodiment of the light emitting device disclosed herein, in which a layered structure of III–V alloy semiconductor alloy is incorporated as an active layer.

FIG. 1 is a cross sectional view of an illustrative embodiment of the light emitting device according to an embodiment, in which a layered structure of the III–V alloy semiconductor layers are incorporated as an active region.

The light emitting device in this embodiment is a laser diode which comprises a semiconductor substrate 1, an active region 3 including at least one strained quantum well layer 2, and a cladding layer 4 for confining carriers and emitted light. The quantum well layer is characterized by having more than 2% of lattice strains against either the semiconductor substrate or cladding layer.

In the light emitting device, the semiconductor substrate 1 is composed of GaAs, and the cladding layer 4 is of either GaInP or GaInPAs. In addition, the device is of the surface emitting type.

Further, the strained quantum well layer is composed of $Ga_xIn_{1-x}N_yAs_{1-y}$ ($0 \leq x \leq 1$, $0 \leq y < 1$), which is characterized to have properties similar to that of non-N containing GaInAs having a photoluminescence peak wavelength of at least 1.12 micron. In addition, the In content in the strained quantum well layer is at least 30% of group-III elements included therein and the N content in the strained quantum well layer is from 0% to 1% of group-V elements included therein.

Still further, the plane orientation of the GaAs substrate 1 is in the (100) direction with an allowable deviation of at most 5°.

Figure 2:
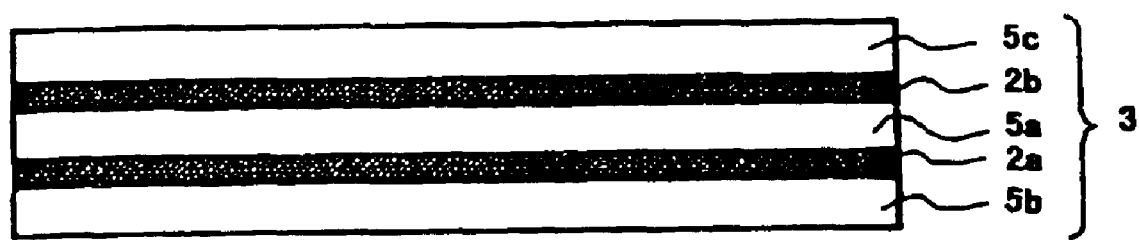
FIG. 2 is a cross-sectional view of a layered structure disclosed herein, including well layers and barrier layers.

The semiconductor light emitting device is further provided with a barrier layer formed contiguous to the strained quantum well layer to relax the stress caused in the quantum well layer. FIG. 2 illustrates the active region 3 incorporating barrier layers, in which there are shown a plurality of the well layers 2a and 2b, and GaNPAs barrier layers 5a, 5b and 5c formed either surrounding or intervening the well layers.

As aforementioned, the amount of lattice strains in the quantum well layer 2 is in excess of 2% against either the semiconductor substrate 1 or the cladding layer 4. This makes the growth feasible, of other materials or composition thereof than previously known, to thereby achieve the fabrication of laser diodes having emission wavelengths not previously available.

Furthermore, since GaAs is chosen as the semiconductor material, wide band gap energy materials which have not been grown thick enough on InP substrate, such as, for example, AlGaAs, AlAs, GaInP and AlInP, can be grown serving as the cladding layer, to thereby yield excellent properties useful for fabricating the laser diodes of the long wavelength region.

Also as aforementioned, since the strained quantum well layers are composed of $Ga_xIn_{1-x}N_yAs_{1-y}$ ($0 \leq x \leq 1$, $0 \leq y < 1$) in the present embodiment, light emissions up to the wavelength of approximately 1.2 micron are feasible for the GaInAs compound (i.e., y=0). Further, for the $Ga_xIn_{1-x}N_yAs_{1-y}$ material, light emissions having wavelengths of 1.3 micron or larger, may be feasible when an appropriate amount of In and/or N is included in the material system.

It is also noted regarding the $Ga_xIn_{1-x}N_yAs_{1-y}$ ($0 \leq x \leq 1$, $0 \leq y < 1$) material that, since the photoluminescence wavelength for the GaInAs compound (i.e., y=0) is already larger than 1.12 micron, other materials or compositions than previously known for the active region material may be grown, thereby allowing a wider range of conditions or of structure design for fabricating the laser diodes.

Specifically, in the GaInAs compound (i.e., y=0), laser diodes having emission wavelengths larger than the previous limit of 1.1 micron have been achieved by adding in excess of 30% of In. In addition, by adding in excess of 30% In into the GaInNAs compound, the N content may be decreased from the previously accepted value and emission wavelength of the 1.3 micron range may be achieved with an N content of less than 1%.

In the light emitting device according to the present embodiment, the N content in the strained quantum well layer is from 0% to 1% of group-V elements included in the layer. The degrading of the crystalline quality in the well layer can be prevented with this small value of N content, which facilitates the formation of the long wavelength laser diodes.

Also in the embodiment, the crystal plane of the GaAs substrate is in (100) with the allowable deviation of at most 5°. This plane direction is more advantageous for growing the desirable quantum well layers than the substrate more deviated toward, for example, the [011] direction, since this facilitates the addition of a large content of In into the strained quantum well layer composed of GaInNAs or GaInAs, to thereby tend to result in longer wavelength emissions and to increase in emission efficiency.

Also in the present embodiment, the cladding layer is composed of either GaInP or GaInPAs. These non-Al containing materials can yield better crystalline quality of well layers at lower temperatures. This is advantageous for forming the strained quantum well layers, for which the low temperature growth is preferable.

For the laser diode of the surface emitting type as in the present embodiment, when this light emitting device can be formed on a GaAs substrate, a multi-layered mirror structure of alternating thin semiconductor layers, or Al(Ga)As/GaAs layers, can be formed, having a large difference in refractive indices. This can result in a mirror with reduced thickness. In addition, a current confinement layer of $AlO_3$ can be formed by oxidizing an AlAs layer laterally from the exposed side portions of that layer. These advantages mentioned just above may be noted over known previous surface emitting types of devices (or laser diodes) having long emission wavelengths fabricated on an InP substrate.

Also in the present embodiment, the semiconductor light emitting device is further provided with a plurality of barrier layers 5a, 5b and 5c, formed contiguous to the strained quantum well layers 2a, 2b to relax the stress caused in the quantum well layer, as shown in FIG. 2. With these barrier or stress compensation layers, the quality of the well layers can be improved and the number of well layers can be increased. This allows a wider range of conditions or of the structure design to be feasible, thereby facilitating achieving the optimum structure of high performance laser devices.

In the method of fabricating a light emitting device comprising an active region 3, including at least one strained quantum well layer 2, and a cladding layer 4 for confining carriers and light emitted, the strained quantum well layer is grown preferably at temperatures of at most 600° C., since the temperatures as low as above-mentioned are favorable for attaining a thicker critical thickness, especially as in the case with the present layer with the lattice strains in excess of 2%.

In addition, in fabricating a semiconductor light emitting device comprising III–V alloy semiconductor layers formed on a semiconductor substrate, the III–V alloy semiconductor layers are preferably formed by metal organic chemical vapor deposition (MOCVD) using organometallic compounds as the source materials. Since this growth method utilizes its high supersaturative nature, this method is favorable to growing highly strained quantum well layers and materials such as, for example, GaInNAs alloy semiconductor composed of N as the group-III element.

Further, in growing the strained quantum well layer composed of $Ga_xIn_{1-x}N_yAs_{1-y}$ ($0 \leq x \leq 1$, $0 \leq y < 1$) for fabricating semiconductor light emitting devices, this layer is formed preferably using nitrogen containing organic compounds selected from the group consisting of dimethylhydrazine and monomethylhydrazine.

Since these compounds have relatively low dissociation temperatures and high vapor pressure, they are preferably used as the N source materials for the layer growth at temperatures as low as below 600° C. This is especially useful for the growth of quantum well layers formed with large strains, for which the growth temperatures are preferably as low as possible ranging from 500° to 600° C.

As aforementioned, the emission wavelength from the GaInAs layer increases with the increase in the In content, when the GaInAs layer is grown on the GaAs substrate. This increase in the In content, however, leads to the increase in the amount of lattice strains. In addition, since the value of the critical lattice strains is approximately 2%, it has been suggested this value yields a limit to the emission wavelength to be approximately 1.1 micron according to IEEE Photonics Technol. Lett. Vol. 9, 1319–1321 (1997).

When a layer of semiconductor is formed on a semiconductor substrate having a lattice constant different from that of the layer, the lattice of the semiconductor layer can dissipate the strain energy through the elastic deformation of the lattice as long as the thickness of the layer is relatively small. However, for an increased thickness of the layer, strain energy can no longer be dissipated through the elastic deformation, and this gives rise to misfit dislocations in the layer, which is not advantageous from the view point of fabricating desirable devices.

The critical thickness is thus defined by the thickness, above which misfit dislocations appear. According to Matthews and Blakeslee, Journal Crystal Growth, Vol. 27, page 118 (1974), the critical thickness was calculated theoretically after dynamical considerations for the growth of a monolayer on a substrate having an infinite thickness. The result obtained as the thickness for the appearance of misfit locations is given as $$h_c = b(1 - \hat{\imath} \cos^2 \hat{a}) \ln\{(h_c/b) + 1\} / \{8\hat{\delta}f(1+\hat{\imath})\cos \ddot{e}\},$$

where $\hat{\imath}$ Poisson ratio $= C_{12}/(C_{11}+C_{12})$ with $C_{11}$ and $C_{12}$, each being elastic stiffness constants, $\cos \hat{a} = \frac{1}{2}$ with $\hat{a}$ being the angle between Burgers vector and the dislocation line at the layer interface, $\cos \ddot{e} = \frac{1}{2}$ with $\ddot{e}$ being the angle between Burgers vector and the direction in the interface perpendicular to the line which is formed by intersecting glide plane and interface.

The above relationship by Matthews and Blakeslee has been accepted, in general, and used presently for calculating critical thickness of GaInAs layers grown on a GaAs substrate. The results from the calculation are shown in FIG. 3.

It is noted that the lattice constant of $Ga_{1-x}In_xNAs$, which is $Ga_{1-x}In_xAs$ added with N, is equal approximately to that of $Ga_{1-y}In_yAs$, where y is smaller by 3% than x.

Figure 3:
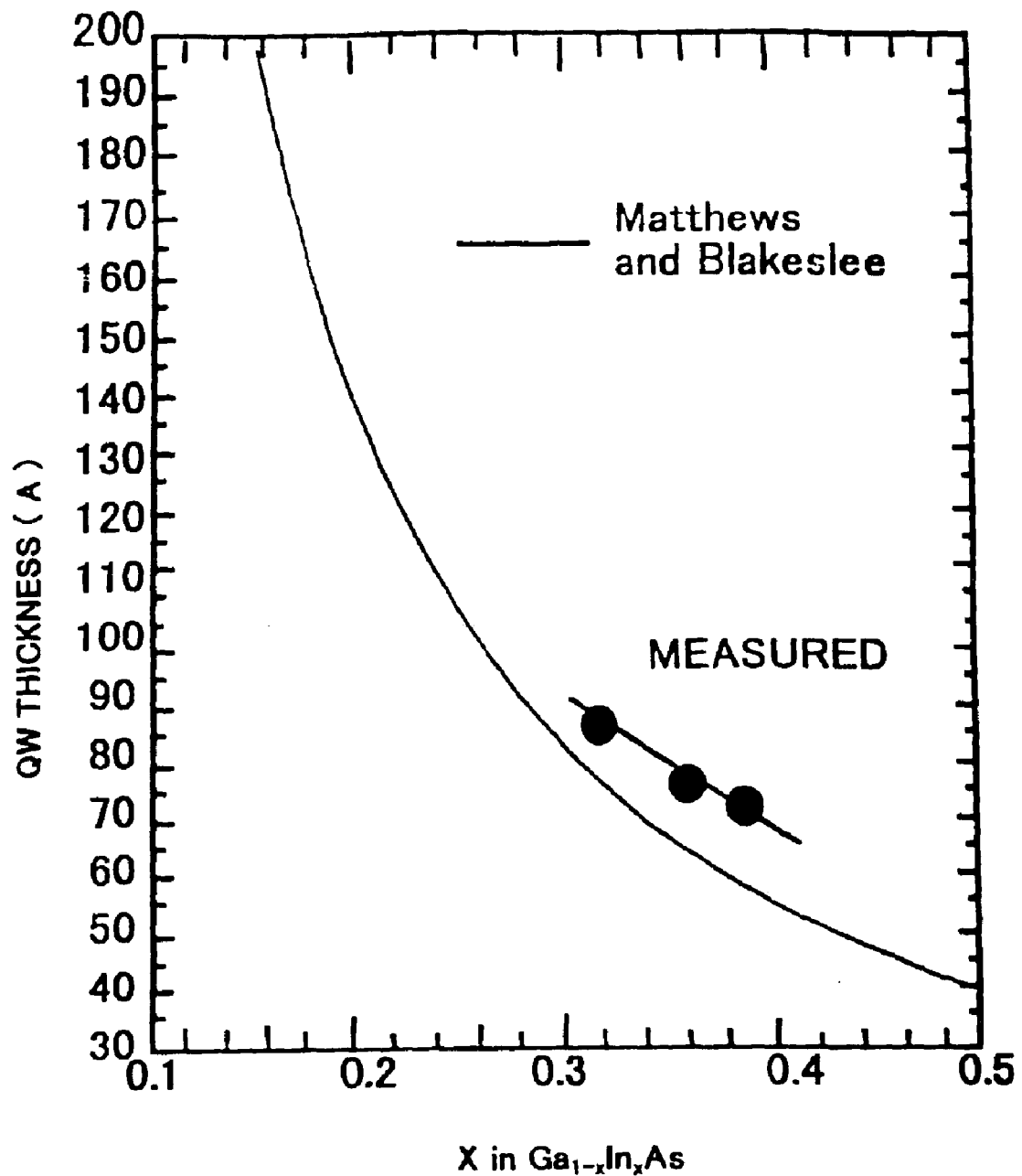
FIG. 3 shows critical thickness versus In content results obtained experimentally together with the results calculated after Matthews and Blakeslee.

It is clearly indicated also in FIG. 3 that, when a $Ga_{1-x}In_xAs$ layer is grown on a GaAs substrate, the thickness which can be grown two-dimensionally on a surface (or critical thickness) decreases with the increase in the In content, since the amount of the lattice strains increases with increasing In content.

In contrast with the relationship, the present inventor has found, as mentioned earlier, that the growth of GaInAs quantum well layer on GaAs is feasible with both the In content exceeding 30% and the amount of the lattice strains against the substrate as large as 2% and more, to thereby lead to a wavelength of laser emissions exceeding 1.1 micron which has been considered to be the limiting value, using the present growth methods under non-equilibrium conditions at low temperatures. That is, from the results that the thus experimentally obtained critical layer thickness surpassed the aforementioned calculated critical thickness of Matthews and Blakeslee, the present inventor has found that a semiconductor light emitting diode (or semiconductor laser) becomes feasible having emission wavelengths exceeding 1.2 micron.

For the $Ga_{1-x}In_xAs$ quantum well layers shown in FIG. 3, wavelengths of the respective photo'luminescence peaks were obtained experimentally to be 1.13 micron for the layer including In 32% and 8.6 nm thick, 1.16 micron for In 36% and 7.8 nm thick, and 1.2 micron for In 39% and 7.2 nm thick. It should be noted once more that these thickness values exceed those obtained by the above relationship of Matthews and Blakeslee.

Figure 4:
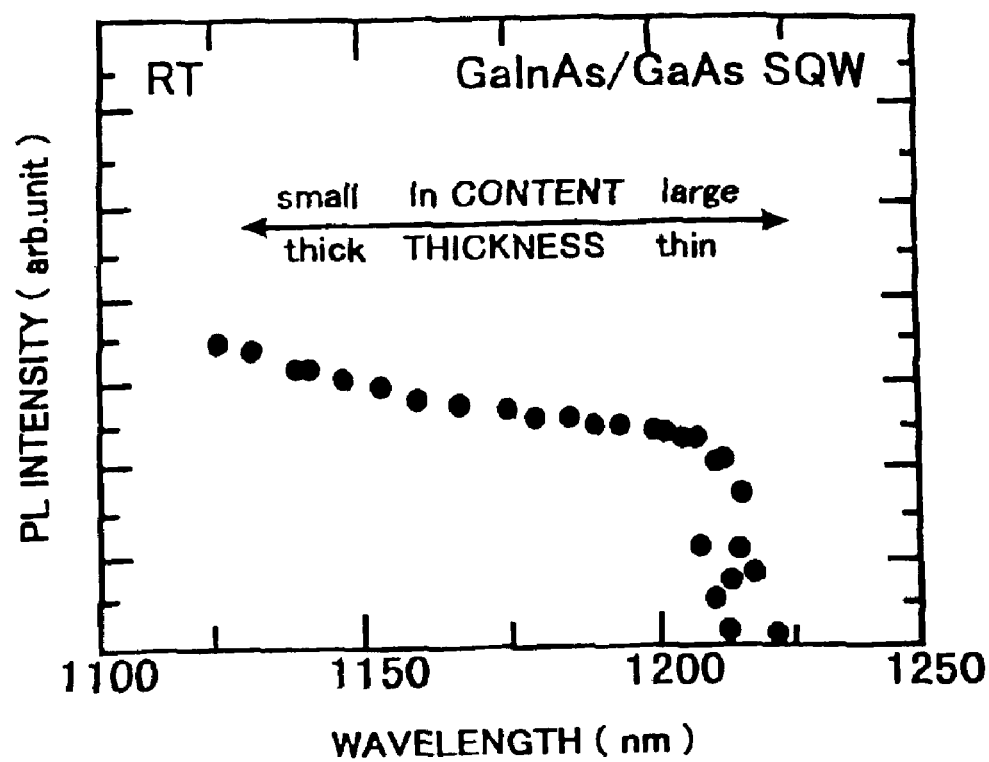
FIG. 4 shows peak wavelength versus intensity results for photoluminescence from $Ga_{1-x}In_xAs$ single quantum well layer.

Peak wavelength versus intensity results for photoluminescence from $Ga_{1-x}In_xAs$ single quantum well layer were also obtained as shown in FIG. 4. The range of In content was chosen from 31% to 42%, which corresponds to the region designated as a solid line in FIG. 3, and the respective thickness of quantum well layers $5a$, $5b$ was adjusted from about 9 nm to about 6 nm decreasing with the increase in the In content. As shown in FIG. 4, the peak intensity decreases only gradually with the increase in peak wavelength up to around 1.2 micron, while it decreases rapidly above 1.2 micron.

It has been found that this change is closely related to that of the surface properties of the layer, in which mirror finished surfaces are observed up to about 1.2 micron wavelength. From the results, it is considered that the rapid decrease in peak intensity mentioned above results from the experimentally obtained critical thickness exceeding the aforementioned calculated critical thickness.

It has been reported that critical thickness, which is experimentally achieved by growth methods such as MOCVD or MBE, is generally increased, when the growth is carried out under extensive non-equilibrium conditions of, such as, low temperatures and/or high growth rate. Under such growth conditions, the experimentally achieved critical thickness ($h_c$) is considered to exceed the aforementioned calculated critical thickness ($h_c'$).

This is exemplified by the above-mentioned results, in which a layer having a larger thickness than the critical thickness has been grown two-dimensionally without developing undesirable misfit dislocations by the present layer growth utilizing non-equilibrium conditions such as low temperatures, among others.

The present inventor has found that the device characteristics of a GaInNAs laser diode can be improved considerably, and that the fabrication of that laser can be carried out with more ease on a GaInP(As) substrate than on AlGaAs, which will be detailed hereinbelow.

As aforementioned, an active layer composed of either GaInNAs or GaInAs can be formed at relatively low temperature such as at, for example, 600° C. at most. However, the growth temperature for AlGaAs is generally as high as 700° C. at least.

The present inventor carried out a series of heat treatment experiments, in which the growth of an AlGaAs cladding layer was assumed on top of an active layer previously formed.

Specifically, the following layers were grown contiguously on a (100) GaAs substrate in the order recited, a GaAs layer having a thickness of 0.2 micron, a GaInNAs quantum well layer having a thickness of 7 nm, and a GaAs layer having a thickness of 50 nm, thereby yielding four samples a, b, c and d. These samples each were the same in the In content, while different in the N content such as 0.2%, 0.2%, 0.5% and 0.8% for the sample a, b, c and d, respectively.

They were subsequently heat treated for 30 minutes in an atmosphere of $AsH_3$ using the MOCVD apparatus at respective temperatures such as at 680° C. for the samples c and d, at 700° C. for sample b, and at 780° C. for sample a. Photoluminescence spectra of the samples were subsequently measured, and photoluminescence versus wavelength results obtained from the measurements are shown in FIG. 5.

Figure 5:
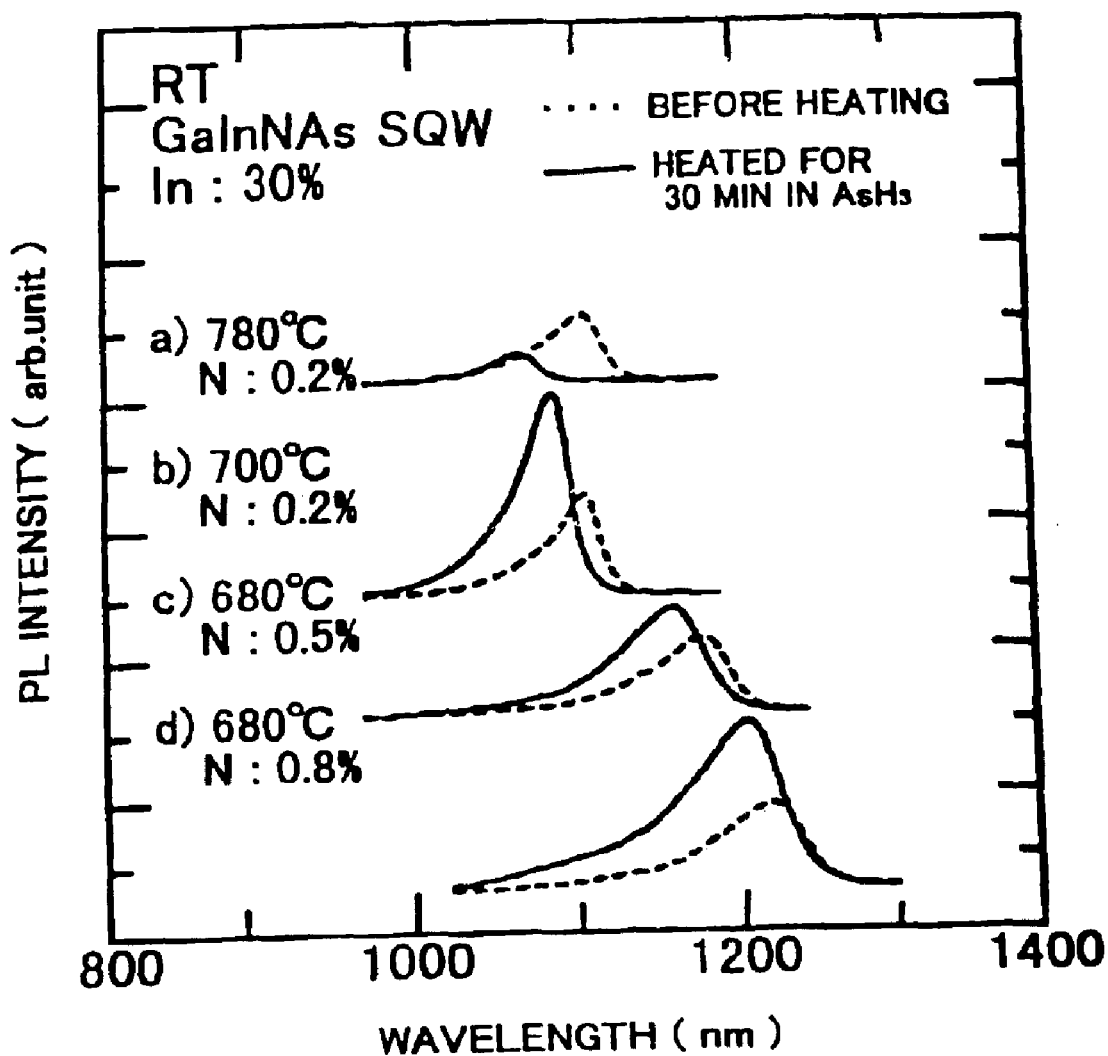
FIG. 5 shows photoluminescence versus wavelength results obtained from a plurality of samples prepared to investigate the effect of the heat treatment.

Referring to FIG. 5, photoluminescence spectra are shown for respective samples prior to the heat treatment with dotted lines, and with solid lines after the treatment. The results indicate that peak wavelength has shifted toward lower wavelengths after the heat treatment, and the amount of the shift is larger at higher temperatures. Also, at the same temperature, the amount of the shift is about the same from one to the other as shown for the samples c and d, which may suggest the shift is ascribed to the diffusion of In atoms in the layer. In addition, the peak intensity decreases by the treatment at 780° C., and increases below 780° C. This increase is ascribed to the decrease in the number of defects, while the decrease is due to the degradation of the crystalline quality of the layer material.

As indicated above, the quality of the highly strained well layers will degrade, when a layer such as, for example, a cladding layer is grown at temperature as high as 780° C. on top of the well layer composed of either GaInNAs or GaInAs. Therefore, it is preferable that a cladding layer overlying the well layer be grown of GaInP(As), which can be satisfactorily grown at relatively low temperatures. Incidentally, AlGaAs may also be used as long as it is grown at 780° C. at most.

There is another factor to be considered regarding the active layer growth. That is, the growth of AlGaAs layer prior to the active layer of either GaInNAs or GaInAs, may degrade the crystalline quality of the latter.

The present inventor prepared two samples, each in which the following layers were grown contiguously on a (100) GaAs substrate in the order recited, a guide layer having a thickness of 0.2 micron, a GaAs layer having a thickness of 100 nm, a GaInNAs quantum well layer having a thickness of 7 nm, a GaAs layer having a thickness of 100 nm, and a guide layer having a thickness of 50 nm.

As the first sample, the guide (or cladding) layer was composed of $Ga_{0.5}In_{0.5}P$ to be referred to as the GaInP sample, hereinafter. Similarly, as the second sample, the guide (or cladding) layer was composed of $Al_{0.4}Ga_{0.6}As$ to be referred to as the AlGaAs sample.

The GaInP sample has a larger In content and a concomitant large lattice strains. Photoluminescence spectra of these two samples were subsequently measured, and photoluminescence versus wavelength results obtained from the measurements are shown in FIG. 6.

Figure 6:
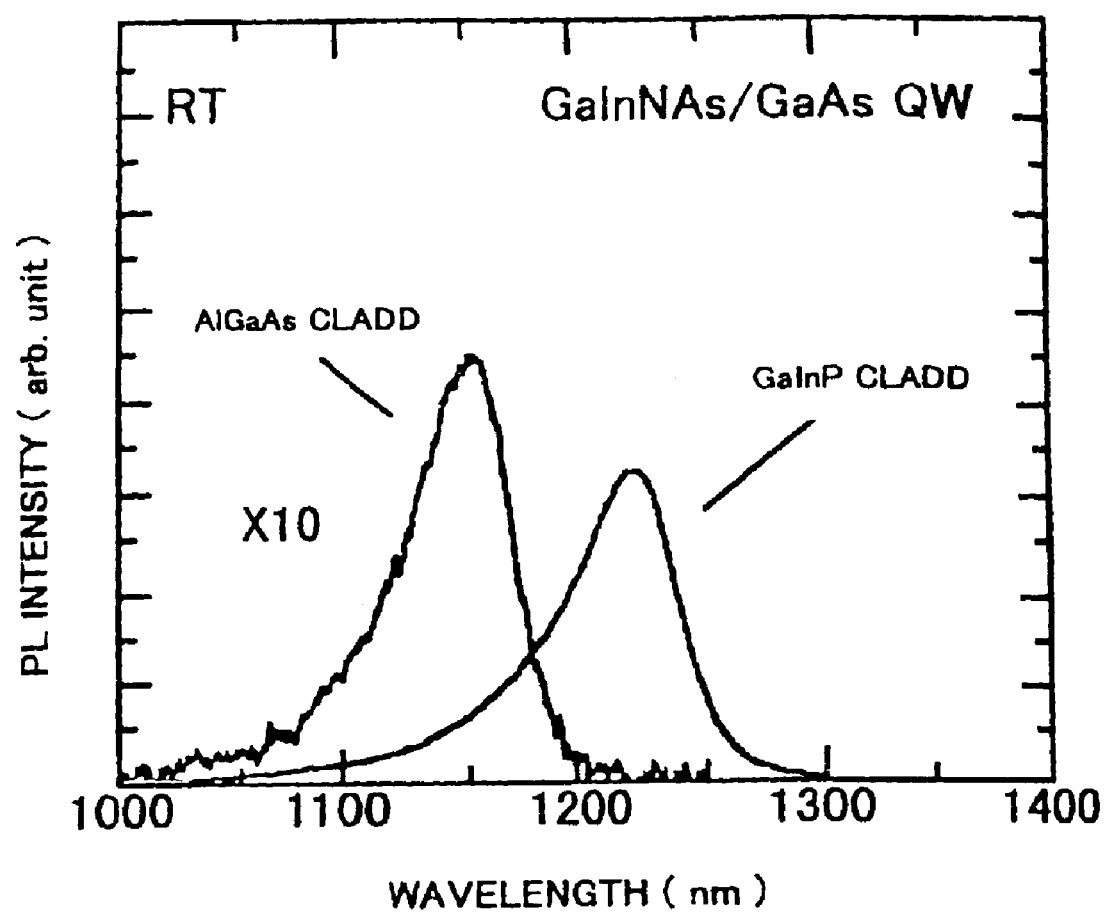
FIG. 6 shows photoluminescence versus wavelength results obtained from a plurality of samples prepared to investigate the effect of the larger In content and concomitant large lattice strains.

From the photoluminescence results shown in FIG. 6, it is indicated that the GaInP sample, which possibly has larger lattice strains caused by the larger In content, has photoluminescence characteristics such as higher in the peak wavelength and lower in the peak intensity than the AlGaAs sample.

These characteristics are considered to be ascribed to the appearance of defects on a crystal surface during the growth, its continuous migration to the newly grown surface, and subsequent arrival at the surface of the GaInNAs well layer, which causes the degradation of the layer properties of the quantum well layers.

Namely, this indicates that the very top surface of epitaxially grown layers has to have excellent quality for satisfactory quantum well layers to be grown thereon having excellent layer qualities. Therefore, it is necessary prior to the growth of the well layers to provide some measure for preventing such defects from being formed or from its migration.

When GaInP(As), which does not contain Al, is used for forming the cladding layer between the semiconductor substrate and the quantum well layer, the top surface of epitaxially grown layers immediately before the well layer growth has excellent quality. Therefore, quantum well layers can be grown with relative ease with large lattice strains.

As described above, GaInNAs is preferably used for forming cladding layers. This is the case especially for the lower cladding layer which is to be positioned between the semiconductor substrate and the quantum well layer.

Furthermore, the present inventor has found the crystal plane of the GaAs substrate is preferably in, or close to, (100) with the allowable deviation of at most 5°. This plane direction is more advantageous for growing the desirable quantum well layers than the substrate more deviated toward, for example, the [011] direction, since this facilitates the addition of a large content of In into the strained quantum well layer composed of GaInNAs or GaInAs, to thereby result in longer wavelength emissions and to increase emission efficiency.

One possible measure to form GaInNAs layers having excellent layer quality, which has 1.3 micron region of stimulated emissions for use in optical communications, is to grow GaInNAs layers having a large In content, thereby resulting in longer emission wavelengths, and to decrease the N content as much as possible.

In order to investigate the effect of the crystalline orientation of the substrate, samples were prepared using two GaAs substrates, one has the (100) plane and the other has the plane direction mis-oriented from the (100) by 15° toward the [011] direction. On the respective GaAs substrates, the following layers were grown contiguously in the order recited, a $Ga_{0.5}In_{0.5}P$ layer having a thickness of 0.2 micron, a GaAs layer having a thickness of 100 nm, an active region which includes GaInNAs quantum well layers, each having a thickness of 7 nm, and GaAs barrier layers, each having a thickness of 13 nm;

a GaAs layer having a thickness of 100 nm, a $Ga_{0.5}In_{0.5}P$ layer having a thickness of 50 nm, and a GaAs layer having a thickness of 50 nm.

Figure 7:
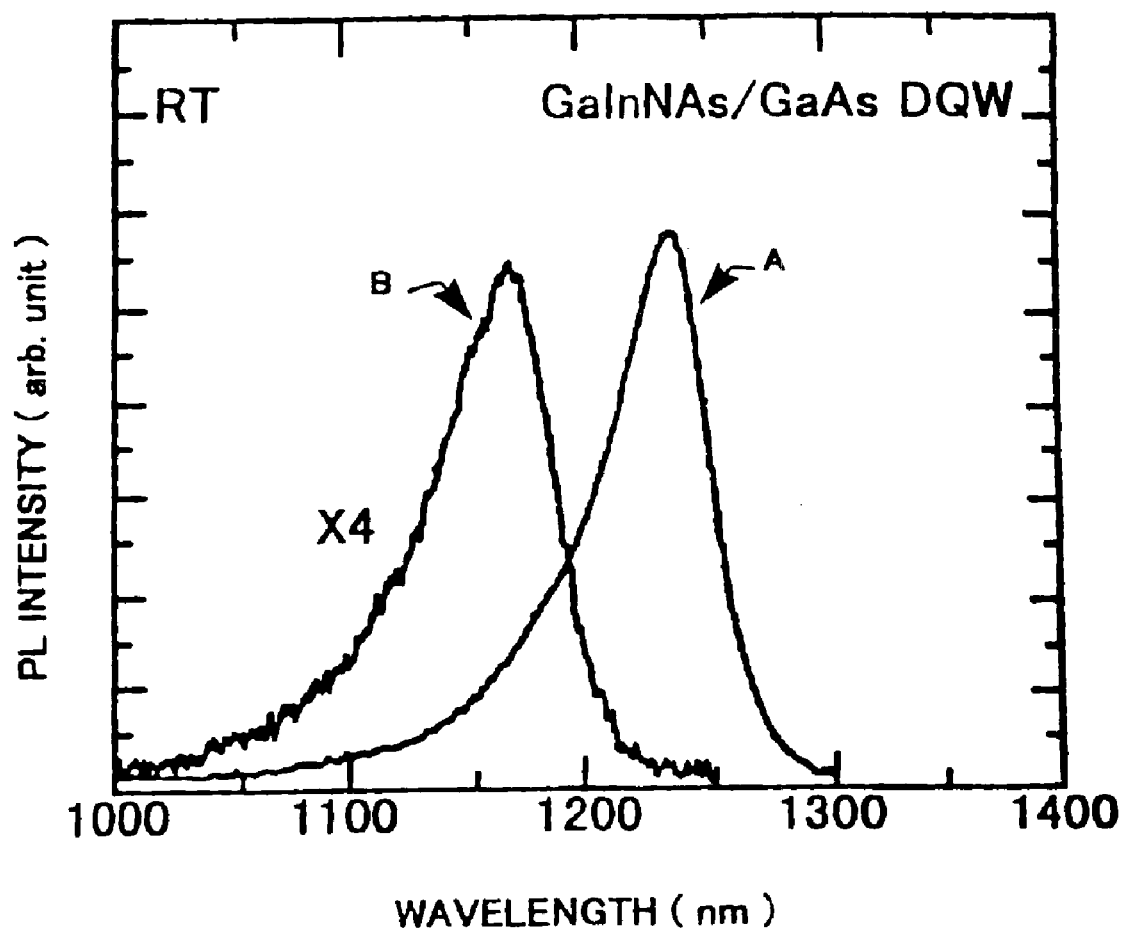
FIG. 7 shows photoluminescence versus wavelength results obtained from a plurality of samples prepared to investigate the effect of the orientation of the substrate.

Photoluminescence spectra of these samples were subsequently measured, and photoluminescence versus wavelength results obtained from the measurements are shown in FIG. 7.

Referring to FIG. 7, photoluminescence spectra designated as A and B are obtained, respectively, for the samples using the substrate having the (100) plane and the plane direction misoriented from the (100) by 15° toward the [011] direction.

During the formation of these samples, the GaInNAs well layer on the latter substrate was formed by adding N to a GaInAs layer which had a photoluminescence peak wavelength of 1.06 micron, while the GaInNAs well layer on the former (100) substrate was formed by adding N to a GaInAs layer which had a photoluminescence peak wavelength of 1.13 micron.

From the photoluminescence results shown in FIG. 7, it is indicated that the light-emitting device formed on the former (100) GaAs substrate incorporating the GaInNAs well layer has a higher peak intensity in spite of its longer wavelength of emissions, which is more advantageous for the device. In contrast, the light emitting device formed on the latter GaAs substrate has its peak intensity decreased considerably.

In addition, another light emitting device was fabricated on the former (100) GaAs substrate, in which the well layer was composed of GaInAs and strong emissions were observed at the wavelength up to 1.2 micron. These results indicate that the crystal plane of the GaAs substrate is preferably in, or close to, (100) with the allowable deviation of at most 5°.

In addition to the above-mentioned methods of improving the crystalline quality considering primarily the degree of lattice strains and critical thickness, the crystalline quality can be improved by including a small amount of Al, which will be detailed hereinbelow.

As indicated earlier, there have been realized several shortcomings in known layer growth methods such as, for example, the difficulty in incorporating an appropriate amount of N into the III–V semiconductor alloy layers. This is considered due to a small rate of the N inclusion into the layers during the layer growth.

For example, in order to obtain 1.3 micron region emissions using a GaInNAs layer grown on a GaAs substrate, 3% of N has to be included at 10% In content. According to the findings by the present inventor, this amount of N is achieved under the gaseous flow conditions during the growth such that a ratio, DMHy (as N source material) to arsine $AsH_3$ (as As source material), has to be increased to 0.9 or larger. This is indicative of the rate of the N inclusion which is lower than that of As inclusion.

The present inventor has found the rate of N inclusion into GaInNAs layer is dependent on the In content as follows.

GaInNAs alloy layers were grown with varying In content on a GaAs substrate by MOCVD. The alloy layers were analyzed by secondary ion mass spectroscopy (SIMS) and the results on the N content are shown in Table 1 in the alloy layers with varying In contents.

TABLE 1

| In content (%) | N content (%) |
|---|---|
| 7 | 2.5 |
| 13 | 1.7 |
| 23 | 0.5 |
| 28 | 0.3 |

The layer growth by MOCVD was carried out using source materials such as trimethylgallium (TMG) for Ga, trimethylindium (TMI) for In, arsine ($AsH_3$) for As, and dimethylhydrazine (DMHy) for N, while hydrogen was used as the carrier gas. During the layer growth, a substrate temperature was at 630° C., and only the feeding rate of trimethylindium as the In source was varied, and the ratio, $[DMHy]/\{[DMHy]+[AsH_3]\}$, was adjusted as 0.95.

The results in Table 1 indicate that the N content decreases considerably with increasing In contents. This is considered due to the bond strength, in which the bonding between In and N is weaker then that between Ga and N.

Since the rate of the N inclusion is low as indicated just above, the issue of N addition is the primary concern for growing layers with excellent quality by known growth methods. Therefore, conditions have to be optimized for the satisfactory layer growth, such as, for example, growth temperature and feeding rate of source gasses, which are disadvantageous to the layer growth.

In the present disclosure, there will be disclosed hereinbelow a method improved over the above-mentioned known method, in which the rate of N inclusion is increased by the addition of a relatively small amount of Al, thereby facilitating the layer growth to possibly be carried out under a wider range of conditions to be optimized for the layer growth, such as, for example, the growth temperature and feeding rate of source gasses.

In one embodiment, a III–V semiconductor alloy includes at least Al as one group-III element and both N and As as group-V elements. With the inclusion of Al as a group-III element and N and As as group-V elements, N inclusion is considerably increased and the layer growth can be conveniently carried out under a wider range of conditions to be optimized for the layer growth, as mentioned earlier.

This is considered due to the difference in the strength of the chemical bond. Namely, the bonding is stronger between Ga and N than In and N, the efficiency of N inclusion increases with the increase of Ga content. In addition, Al is quite active chemically, the bonding between Al and N is stronger than Ga and N. Therefore, by including Al as one group-III element in a III–V semiconductor alloy which contains N and at least one of other group-V elements, the rate of N inclusion can increase considerably.

Although the rate of this N inclusion increases with the increase in the Al content as one group-III element, even a small amount of Al is quite effective for the increase. The N containing III–V semiconductor alloy is therefore obtained with relative ease having excellent crystalline quality.

In addition, according to the embodiment, the III–V semiconductor alloy may have a composition of either $Al_xGa_yIn_{1-x-y}N_zAs_{1-z}$ (0<x<1, 0<y<1) or $Al_xIn_{1-x}N_yP_zAs_{1-y-z}$ (0<x<1, 0<y<1, 0≦z<1). With this structure, the inclusion of N into either GaInNAs or InNPAs is achieved by the above-mentioned Al addition, thereby resulting in excellent crystalline quality. This is an improvement for the GaInNAs and InNPAs systems, which have suffered from degrading of the crystalline quality in spite of their excellent capability for use in the field of optical communications. Further, by this Al inclusion of a small amount, the layer growth has become feasible under a wider range of conditions to be optimized for the layer growth, such as, for example, the growth temperature and feeding rate of source gasses.

Namely, GaInNAs is the form of mixed crystals of GaInAs and GaInN. The former has a lattice constant larger than GaAs, while the latter has a lattice constant smaller than GaAs. When the GaInNAs is formed by adding N into GaInAs, the lattice constant decreases, to thereby be lattice-matched to GaAs. Since N has a larger electronegativity than other elements, band gap energy of the GaInNAs layers further decreases. As a result, light emissions at the wavelength region of 1.3 $\mu$m or 1.5 $\mu$m may become feasible in the devices using the GaInNA material.

However, the rate of the N inclusion with respect to the amount of As is rather small. In addition, this rate is dependent on the In content and decreases with the increase in the In content. This is considered due to a weaker bonding between In and N than Ga and N.

Likewise, InNPAs is the form of mixed crystals of InPAs and InN. InPAs has a lattice constant larger than InP. When InNPAs is formed by adding InN, which has a lattice constant smaller than InP, into InPAs, the lattice constant decreases, to thereby possibly be lattice-matched to InP, having a concomitant band gap energy. As a result, light emissions at the wavelength region of 1.3 $\mu$m, 1.5 $\mu$m and possibly longer, may become feasible in the devices using the InNPAs material. In addition, the InNPAs material can increase its band gap energy by adding N in the similar manner to the GaInNAs. However, the rate of the N inclusion is very low because of the inclusion of only In as the group-III element and also of the weak bonding between In and N.

The bonding between Al and N is stronger than either between Ga and N or between In and N, the rate of N inclusion can be increased by adding Al. In the present embodiment, the N inclusion has been increased by the Al addition, to thereby yield alloy crystals having a large N content with relative ease.

In another embodiment, a III–V semiconductor alloy layer for forming a light emitting device includes at least Al as one group-III element and both N and As as group-V elements. With the inclusion of Al as a group-III element and N and As as group-V elements, N inclusion is considerably increased and the layer growth can be conveniently carried out under a wider range of conditions to be optimized for the layer growth, such as, for example, the growth temperature and feeding rate of source gasses With this construction, a heterojunction can be formed between the above-mentioned III–V semiconductor alloy layer (the quantum well) and a contiguous cladding layer, having a conduction band discontinuity formed with sufficient magnitude for preventing overflow of injected carriers (electrons) from the active layer to the cladding layer. This may give rise to improved device characteristics especially at high temperatures.

In addition, as described above, the rate of N inclusion is increased by adding Al, thereby facilitating the inclusion of N element into the compositional layers during the growth. The layer growth can therefore be carried out under a wider range of conditions to optimize for the layer growth, such as, for example, temperature and feeding rate of source gasses. This facilitates the growth of compositional layers with improved crystalline quality of the layers and device characteristics of the VCSELs and edge emitting lasers.

In addition, according to the embodiment, the III–V semiconductor alloy layer may have a composition of either $Al_xGa_yIn_{1-x-y}N_zAs_{1-z}$ (0<x<1, 0<y<1) or $Al_xIn_{1-x}N_yP_zAs_{1-y-z}$ (0<x<1, 0<y<1, 0≦z<1). With this structure, the inclusion of N into either GaInNAs or InNPAs is achieved by the above-mentioned Al addition, thereby resulting in excellent crystalline quality. This is an improvement for the GaInNAs and InNPAs systems, which have suffered from degrading of the crystalline quality in spite of their excellent capability for use in the field of optical communications. Further, by this Al inclusion of a small amount, the layer growth has become feasible under a wider range of conditions to be optimized for the layer growth, as mentioned above.

In addition, with this construction, since a heterojunction can be formed between the above-mentioned III–V semiconductor alloy layer (the quantum well) and a contiguous cladding layer, having a conduction band discontinuity formed with sufficient magnitude for preventing overflow of injected carriers (electrons) from the active layer to the cladding layer. This gives rise to improved device characteristics especially at high temperatures, as well.

Further, as described above, the rate of N inclusion is increased by adding Al, thereby facilitating the inclusion of N element into the compositional layers during the growth. The layer growth can therefore be carried out under a wider range of conditions to optimize for the layer growth, such as, for example, temperature and feeding rate of source gasses. This facilitates the growth of compositional layers with improved crystallinity of the layers and device characteristics of the dielectric-stripe laser.

In another embodiment, the active layer incorporated in the semiconductor light emitting device is surrounded by a structure either having no Al content or Al content less than that in the active layer. With this construction, the active well layer is interposed between other layers such as those having a band gap energy larger than the well layer, without incorporating excessive N into the interfacing portion between the well layer and the spacer layer which is contiguous to the well layer. As a result, the double-hetero structure is formed with excellent properties and device characteristics of the VCSELs and edge emitting lasers can further be improved.

Namely, a semiconductor light emitting device, in general, has to be constructed such that a light emitting layer is interposed between other layers which have band gap energies larger than the light emitting layer. Examples of the material for giving rise to the large band gap energy include, and are not limited to, AlGaAs, GaInP(As), AlGaInP, InP, and AlGaInAs.

Therefore, a light emitting layer is often grown on top of an Al containing material which has a wide band gap energy, comprising a III–V semiconductor alloy and including N and other group-V elements. In such a case, the rate of N inclusion into the active layer increases to thereby result in the increase in the amount of N incorporated into the interface portion between the active layer and its neighboring layer with a rate larger than that into the active layer, and this results in a concomitant decrease in crystalline properties.

As described above, the spacer layers are employed so as to contain none of, or less than the well layer of Al and contiguous to the active well layer. In this embodiment, therefore, the incorporation of excessive N into the interfacing portion can be prevented and device characteristics of the light emitting device can be further improved.

In another embodiment, a method of forming a III–V semiconductor alloy is disclosed. The III–V semiconductor alloy contains at least Al as one group-III element and both N and As as group-V elements, and the method comprises the step of depositing the III–V alloy semiconductor layers by metal organic chemical vapor deposition (MOCVD) using organometallic compounds selected from the group consisting of trimethylaluminum and trimethylaluminum, as the Al source.

The MOCVD method is capable of producing a high degree of super-saturation on the surface of layers during the growth using organometallic compounds such as trimethylaluminum and trimethylaluminum are used as the Al source. Therefore, with this method using these compounds which can dissociate at relatively low temperatures, an appropriate N addition can be carried out, to thereby be able to achieve the growth of the III–V semiconductor alloy layer having excellent crystalline quality.

In this method using MOCVD, organometallic compounds such as dimethylhydrazine and monomethylhydrazine are preferably used as the N source for depositing the III–V alloy semiconductor layers. With this method, these compounds have relatively low dissociation temperatures and high vapor pressure, they are preferably used as the N source materials for the layer growth at low temperatures. This is especially useful for the growth of quantum well layers formed with large strains, for which the growth temperatures are preferably as low as possible, to thereby be able to achieve the growth of the III–V semiconductor alloy layer having excellent crystalline quality.

In another embodiment, a method of fabricating a light emitting device incorporating a III–V semiconductor alloy as an active layer is disclosed. The III–V semiconductor alloy can be formed having excellent crystalline quality as described above. The light emitting device thus fabricated has improved device characteristics at high, temperatures as well, as mentioned earlier.

With the present structure of layered III–V alloy semiconductor disclosed herein, a conduction band discontinuity may be formed with sufficient magnitude for preventing overflow of injected carriers. This may yield the fabrication of laser diodes having improved temperature characteristics, which is useful for fabricating durable laser diodes with longer emission wavelengths.

As a result, light emissions at the wavelength region of 1.3 $\mu$m, 1.5 $\mu$m and possibly longer become feasible. Light emitting devices such as, for example, edge emitting lasers and VCSEL devices may therefore be fabricated with improved emission efficiency and other favorable device characteristics.

The following examples are provided further to illustrate preferred embodiments disclosed herein. This is intended to be illustrative but not to be limiting to the materials, processes or devices described herein.

EXAMPLE

In the course of the following description, the same figure will be referred to in several examples to designate light emitting devices having a similar, but not necessarily identical device structure. In such cases, additional figures will be provided, when relevant, to point out several specific points such as, for example, the difference in the structure between the devices currently discussed.

Example 1

Figure 8:
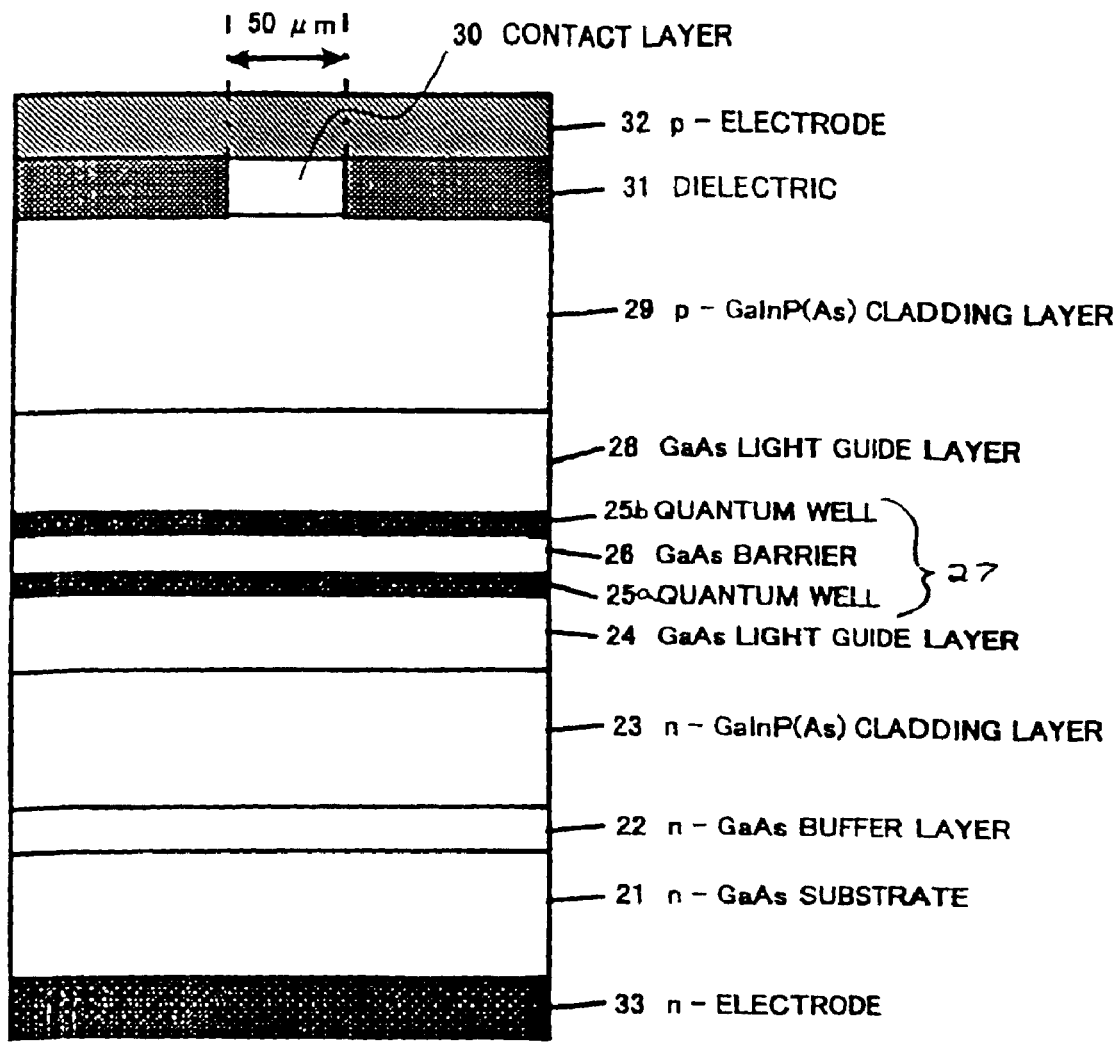
FIG. 8 a cross sectional view of another embodiment of the light emitting device disclosed herein, in which a layered structure of III–V alloy semiconductor alloy is incorporated as an active layer.

A light emitting device according to the present invention was fabricated as illustrated in FIG. 8. The device was a dielectric-stripe laser incorporating an SCH-DQW (separate confinement heterostructure double quantum well) layer structure.

Referring to FIG. 8, the light emitting device was formed on a (100) n-GaAs substrate 21 with the following layers grown contiguously thereon, in the order recited:

an n-GaAs buffer layer 22, an n-GaInP(As) lower cladding layer 23 having a thickness of 1.5 micron, a GaAs light guide layer 24 having a thickness of 100 nm, an active (i.e., light emitting) region 27, having a thickness of 13 nm and including $Ga_{1-x}In_xAs$ quantum well layers 25a, 25b and a GaAs barrier layer 26 interposed therebetween;

a GaAs light guide layer 28 having a thickness of 100 nm, a p-GaInP(As) upper cladding layer 29 having a thickness of 1.5 micron, and a p-GaAs contact layer 30 having a thickness of 0.3 micron.

Subsequently, the p-GaAs contact layer 30 was subjected to known masking and etching processes, in which portions thereof were removed except those used for forming a current inlet 30. A positive electrode 32 was then provided over the current inlet portion 30 with an underlying dielectric layer 31, while a negative electrode 33 was provided on the rear side of the n-GaAs substrate 21.

In the present embodiment, the In content x in the $Ga_{1-x}In_xAs$ quantum well layers 25a, 25b was chosen from 31% to 40% and the respective thickness of quantum well layers 25a, 25b was adjusted from about 9 nm to about 6 nm decreasing with the increase in the In content. It should be noted that these thickness values exceed those obtained by the above relationship of Matthews and Blakeslee.

As aforementioned referring to FIG. 3, respective photoluminescence peaks were observed experimentally at 1.13 micron for the layer including In 32% and 8.6 nm thick, 1.16 micron for In 36% and 7.8 nm thick, and 1.2 micron for In 39% and 7.2 nm thick. In addition, the amount of compressive strain for these layers were found to be varied from 2.2% to 2.7% depending on the layer composition.

The compositional layers were grown by MOCVD, using source materials such as TMG, TMI, AsH$_3$ and PH$_3$, while hydrogen was used as carrier gas. The $Ga_{1-x}In_xAs$ quantum well layers were grown at approximately 550° C.

Figure 9:
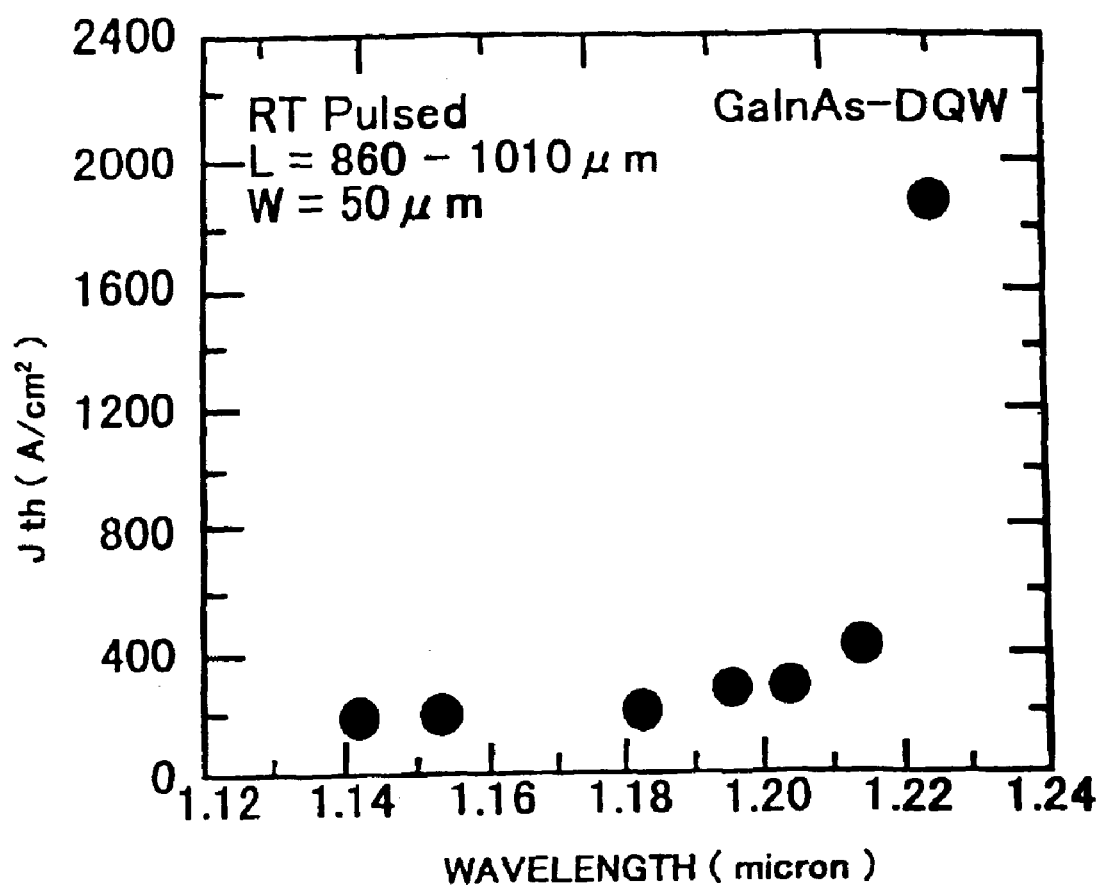
FIG. 9 shows threshold current density versus laser emission wavelength results for the device of FIG. 8.

FIG. 9 shows threshold current density $J_{th}$ versus laser emission wavelength results for the device of FIG. 8. As shown in FIG. 9, the laser emission wavelength ranges from 1.13 to 1.23 micron, which is longer than known GaInAs quantum well lasers fabricated on GaAs substrates. Also shown in FIG. 9 are $J_{th}$ values of approximately 200 A/cm$^2$ achieved by the device in the wavelength region up to approximately 1.2 micron, which is low enough for a practical laser device, although a sharp increase is observed in the $J_{th}$ value above 1.2 micron. In addition, high temperature characteristics have been found satisfactory for the laser devices.

Although the growth method of the compositional layers for the laser device was referred to the case with MOCVD in this example, other methods may also be used alternatively such as MBE and other similar methods.

In addition, although the structure of the active layer was referred to the case with a double quantum well (DQW), other structures may also be adopted, including other numbers of quantum wells such as, for example, single-quantum well (SQW) and multi-quantum wells (MQW).

Further, the respective thicknesses of the compositional layers is not limited to that described above, but other thicknesses may be adopted for forming the laser structure, when relevant. In addition, the cladding layers of the AlGaAs system may be alternatively formed which have band gap energies as large as the GaInP described above. Still further, laser structures may also appropriately be adopted other than those described above in the present example.

For the crystal plane orientation of the GaAs substrate, the direction of approximately (100) is preferred with allowable deviation of approximately 5° at most. It may be noted in this context that there are often grown hill-shaped defects or hillocks for MOCVD growth of GaInP layers onto a GaAs substrate having on- or slightly off-(100) orientation.

This is not preferable, since disadvantages may arise such as a decrease in the device production yield and emission efficiency. Although the density of the hillock formation may decrease by optimizing growth conditions, this can also be achieved with relative ease by utilizing GaInPAs (i.e., GaInP incorporated with As). A slight amount of As has been found quite effective and preferably used for this layer growth.

Example 2

A further light emitting device according to the present invention was fabricated in a manner similar to Example 1, with the exception that the active region included $Ga_{0.67}In_{0.33}N_{0.006}As_{0.994}$ quantum well layers and GaAs barrier layers, in place of the $Ga_{1-x}In_xAs$ quantum well layers and GaAs barrier layer of Example 1.

The device was a dielectric-stripe laser incorporating an SCH-DQW layer structure.

Now referring again to FIG. 8, the light emitting device was formed on a (100) n-GaAs substrate with the following layers grown contiguously thereon, in the order recited:

an n-GaAs buffer layer, an n-GaInP(As) lower cladding layer having a thickness of 1.5 micron, a GaAs light guide layer having a thickness of 100 nm, an active region including $Ga_{0.67}In_{0.33}N_{0.006}As_{0.994}$ quantum well layers and GaAs barrier layers each having a thickness of 13 nm and interposed therebetween, which were formed in similar manner to those illustrated in FIG. 2, a GaAs light guide layer having a thickness of 100 nm, a p-GaInP(As) upper cladding layer having a thickness of 1.5 micron, and a p-GaAs contact layer having a thickness of 0.3 micron.

Subsequently, the p-GaAs contact layer was subjected to known masking and etching processes, in which portions thereof were removed except those used for forming a current inlet. A positive electrode was then provided over the current inlet portion with an underlying dielectric layer, while a negative electrode was provided on the rear side of the n-GaAs substrate.

In the present embodiment, the contents of In and N in the quantum well layers were chosen 33% and 0.6%, respectively, and the thickness of these well layers was 7 nm. In addition, the amount of compressive strains in these layers were found to be 2.3%.

The compositional layers were grown by MOCVD, using source materials such as TMG, TMI, $AsH_3$ and $PH_3$, while DMHy was used as the N source.

DMHy has a relatively low dissociation temperature and high vapor pressure, to thereby preferably be used as the N source materials for the layer growth at temperatures as low as below 600° C. This is especially useful for the growth of quantum well layers formed with large strains, for which the growth temperatures are preferably as low as possible ranging from 500° to 600° C. In the present embodiment, the above-mentioned GaInNAs layers were grown at 550° C. In addition, hydrogen was used as the carrier gas.

Figure 10:
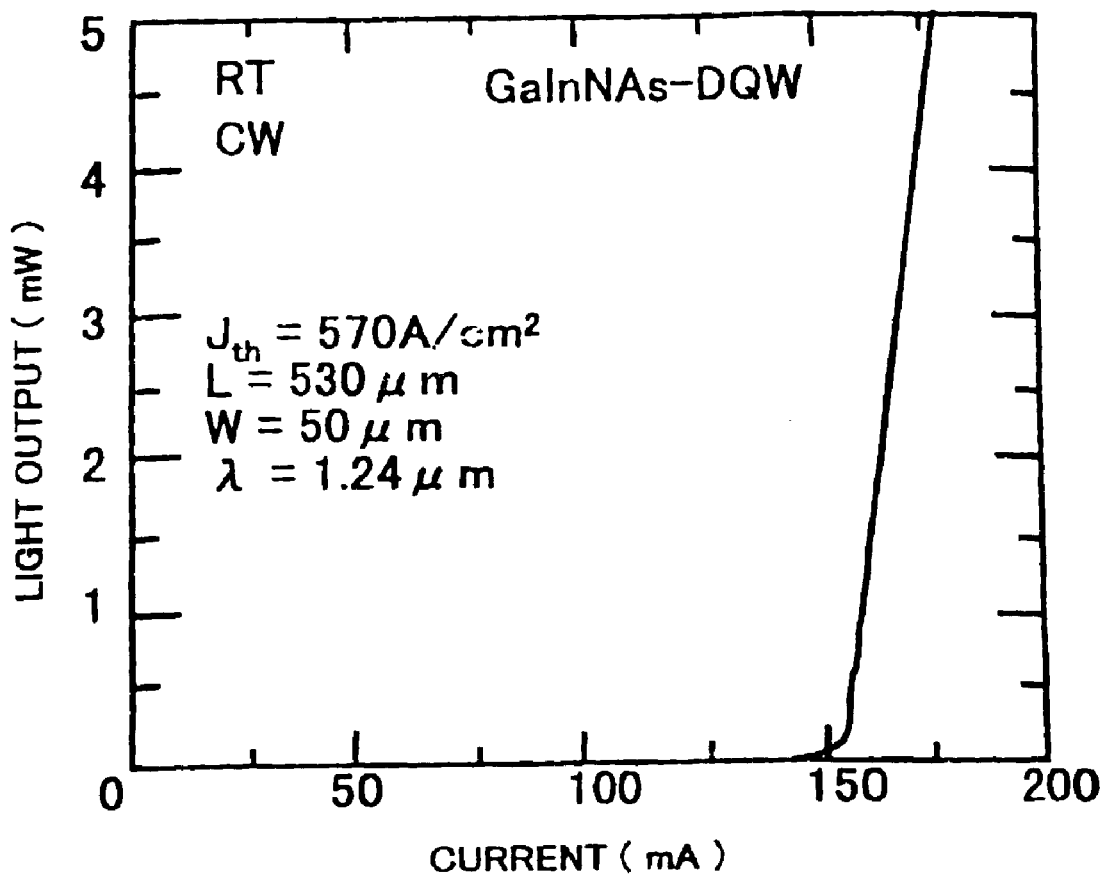
FIG. 10 shows light output versus current density results for the device with an active layer having the compressive strains of at least 2%.

FIG. 10 shows results of light output versus current density measurements during the CW operation for the thus fabricated device. As shown in FIG. 10, a threshold current $J_{th}$ was obtained as approximately 570 A/cm$^2$ at the laser emission wavelength of 1.24 micron. In the device according to the present embodiment, an In content of larger than 30% and compressive strain of at least 2% have been achieved. As a result, the $J_{th}$ values have also decreased considerably, thereby achieving excellent device characteristics at high temperatures, as well. In addition, it may be noted that the wavelength of laser emission can be varied depending on the content of N or In, and/or the thickness of the quantum well layer.

Although the growth method of the compositional layers for the device was referred to the case with MOCVD in this embodiment, other methods may also be used alternatively such as MBE and other similar methods.

In addition, although the growth of the layers was described using DMHy as the N source material, other materials may alternatively be used such as activated N species, $NH_3$ and other appropriate N compounds.

In addition, although the structure of the active layer was referred to the case with a double quantum well (DQW), other structures may also be adopted, including other numbers of quantum wells such as, for example, single-quantum well (SQW) and multi-quantum wells (MQW). Further, the respective thicknesses of the compositional layers is not limited to that described above, but other thicknesses may be adopted for forming the laser structure, when relevant. In addition, the cladding layers of the AlGaAs system may be alternatively used which have band gap energies as large as the GaInP described above. Still further, laser structures may also appropriately be adopted other than those described above in the present example.

Example 3

A light emitting device according to the present invention was fabricated in a manner similar to Example 2, with the exception that an n-GaAs substrate was used such that the direction normal to the surface thereof was misoriented by approximately 2° from the direction normal to the (100) plane toward the [011] direction, and that the active region comprised $Ga_{0.6}In_{0.4}N_{0.005}As_{0.995}$ quantum well layers.

The device was a dielectric-stripe laser incorporating an SCH-DQW layer structure.

Referring again to FIG. 8, the light emitting device was formed on the above-mentioned n-GaAs substrate with the following layers grown contiguously thereon, in the order recited:

an n-GaAs buffer layer, a n-GaInP(As) lower cladding layer having a thickness of 1.5 micron, a GaAs light guide layer having a thickness of 100 nm, an active region including $Ga_{0.6}In_{0.4}N_{0.005}As_{0.995}$ quantum well layers and GaAs barrier layers each having a thickness of 13 nm and interposed therebetween, which were formed in similar manner to those illustrated in FIG. 2, a GaAs light guide layer having a thickness of 100 nm, a p-GaInP(As) upper cladding layer having a thickness of 1.5 micron, and a p-GaAs contact layer having a thickness of 0.3 micron.

Subsequently, the p-GaAs contact layer was subjected to known masking and etching processes, in which portions thereof were removed except those used for forming a current inlet. A positive electrode was then provided over the current inlet portion with an underlying dielectric layer, while a negative electrode was provided on the rear side of the n-GaAs substrate.

In the present embodiment, the contents of In and N in the quantum well layers 65a, 65b were chosen 40% and 0.5%, respectively, and the thickness of these well layers was 7 nm. It is noted that these thickness values exceed the critical thickness $h_c$ of approximately 6.1 nm obtained by the aforementioned relationship of Matthews and Blakeslee.

In addition, the amount of compressive strains in these layers were found to be 2.7%.

The compositional layers were grown by MOCVD, using source materials such as TMG, TMI, $AsH_3$ and $PH_3$, while DMHy was used as the N source.

DMHy has a relatively low dissociation temperature and high vapor pressure, to thereby preferably be used as the N source materials for the layer growth at temperatures as low as below 600° C. This is especially useful for the growth of quantum well layers formed with large strains, for which the growth temperatures are preferably as low as possible ranging from 500° to 600° C. In the present embodiment, the above-mentioned GaInNAs layers were grown at 540° C. In addition, hydrogen was used as the carrier gas.

The thus fabricated laser device was found to have emissions at 1.3 micron, and the threshold current $J_{th}$ thereof was obtained as approximately 1 kA/cm$^2$. It is known that threshold current $J_{th}$ values for GaInNAs lasers tend to increase with the increase in the N content, and that the N content for previous 1.3 micron region GaInNAs lasers are 1% at least at In content of 30%.

Therefore, it is clearly shown from the present results that the N content in the present active layers considerably decreased with the inclusion of as much as 30% of In and also with compressive strains of 2% at least, thereby achieving a considerable decrease in the threshold current and excellent high temperature device characteristics.

Although the growth method of the compositional layers for the device was referred to the case with MOCVD in this embodiment, other methods may also be used alternatively such as MBE and other similar methods.

In addition, although the growth of the layers was described using DMHy as the N source material, other materials may alternatively be used such as activated N species, $NH_3$ and other appropriate N compounds.

In addition, although the structure of the active layer was referred to the case with a double quantum well (DQW), other structures may also be adopted, including other numbers of quantum wells such as, for example, single-quantum well (SQW) and multi-quantum wells (MQW). Further, the respective thicknesses of the compositional layers is not limited to that described above, but other thicknesses may be adopted for forming the laser structure, when relevant. In addition, the cladding layers of the AlGaAs system may be alternatively used which have band gap energies as large as the GaInP described above. Still further, laser structures may also appropriately be adopted other than those described above in the present example. In addition, as the materials for forming tensile strained barrier layers, several materials other than GaNPAs can also be utilized such as GaAsP, GaInAsP and GaNAs.

Example 4

A light emitting device according to the present invention was fabricated in a manner similar to Example 3, with the exception that an n-GaAs substrate was used such that the direction normal to the surface thereof was misoriented by approximately 5°, in place of approximately 2° in Example 3, from the direction normal to the (100) plane toward the [011] direction, and that the active region comprised $Ga_{0.65}In_{0.35}N_{0.007}As_{0.993}$ quantum well layers.

The device was a dielectric-stripe laser incorporating an SCH-DQW layer structure.

Referring again to FIG. 8, the light emitting device was formed on the above-mentioned n-GaAs substrate with the following layers grown contiguously thereon, in the order recited:

an n-GaAs buffer layer, an n-GaInP(As) lower cladding layer having a thickness of 1.5 micron, a GaAs light guide layer having a thickness of 100 nm, an active region including $Ga_{0.65}In_{0.35}N_{0.007}As_{0.993}$ quantum well layers and GaNPAs barrier layers each having a thickness of 10 nm, and surrounding or interposed between the active layers, as illustrated in FIG. 2;

a GaAs light guide layer having a thickness of 100 nm, a p-GaInP(As) upper cladding layer having a thickness of 1.5 micron, and a p-GaAs contact layer having a thickness of 0.3 micron.

Subsequently, the p-GaAs contact layer was subjected to known masking and etching processes, in which portions thereof were removed except those used for forming a current inlet. A positive electrode was then provided over the current inlet portion with an underlying dielectric layer, while a negative electrode was provided on the rear side of the n-GaAs substrate.

In the present embodiment, the contents of In and N in the quantum well layers were chosen 35% and 0.7%, respectively, and the thickness of these well layers was 7 nm. In addition, the amount of compressive strains in these layers were found to be 2.4%. In this layered structure, the compressive stress in the well layers are counteracted or relaxed, by tensile stress by the barrier layers. Examples of materials for forming the barrier layers include those having smaller lattice constants than that of GaAs, such as GaInPAs, GaPAs, GaInNPAs, GaNPAs and GaNAs.

The compositional layers were grown by MOCVD, using source materials such as TMG, TMI, $AsH_3$ and $PH_3$, while DMHy was used as the N source.

DMHy has a relatively low dissociation temperature and high vapor pressure, to thereby preferably be used as the N source materials for the layer growth at temperatures as low as below 600° C. This is especially useful for the growth of quantum well layers formed with large strains, for which the growth temperatures are preferably as low as possible ranging from 500° to 600° C. In the present embodiment, the above-mentioned GaInNAs layers were grown at 520° C. In addition, hydrogen was used as the carrier gas.

The thus fabricated laser device was found to have emissions at 1 3 micron, and the threshold current $J_{th}$ thereof was obtained as approximately 1 $kA/cm^2$. As described earlier, it is known that threshold current $J_{th}$ values for GaInNAs lasers tend to increase with the increase in the N content, and that the N content for previous 1.3 micron region GaInNAs lasers are 1% at least at In content of 30%.

Therefore, it is clearly shown from the present results that the N content in the present active layers considerably decreased with the inclusion of as much as 30% of In and also with compressive strains of 2% at least, thereby achieving a considerable decrease in the threshold current. Further, with the barrier layers provided in this embodiment, having the tensile strains which affect to relax the compressive strains in the well layers, there have been achieved a further decrease in the threshold current and excellent device characteristics at high temperatures, as well.

Although the growth method of the compositional layers for the device was referred to the case with MOCVD in this embodiment, other methods may also be used alternatively such as MBE and other similar methods. In addition, although the growth of the layers was described using DMHy as the N source material, other materials may be used alternatively such as activated N species, $NH_3$ and other appropriate N including materials.

In addition, although the structure of the active layer was referred to the case with a double quantum well (DQW), other structures may also be adopted, including other numbers of quantum wells such as, for example, single-quantum well (SQW) and multi-quantum wells (MQW). Further, the respective thicknesses of the compositional layers is not limited to that described above, but other thicknesses may be adopted for forming the laser structure, when relevant. In addition, the cladding layers of the AlGaAs system may be used alternatively which have band gap energies as large as the GaInP described above. Further still, laser structures may also appropriately be adopted other than those described above in the present example.

Example 5

Figure 11:
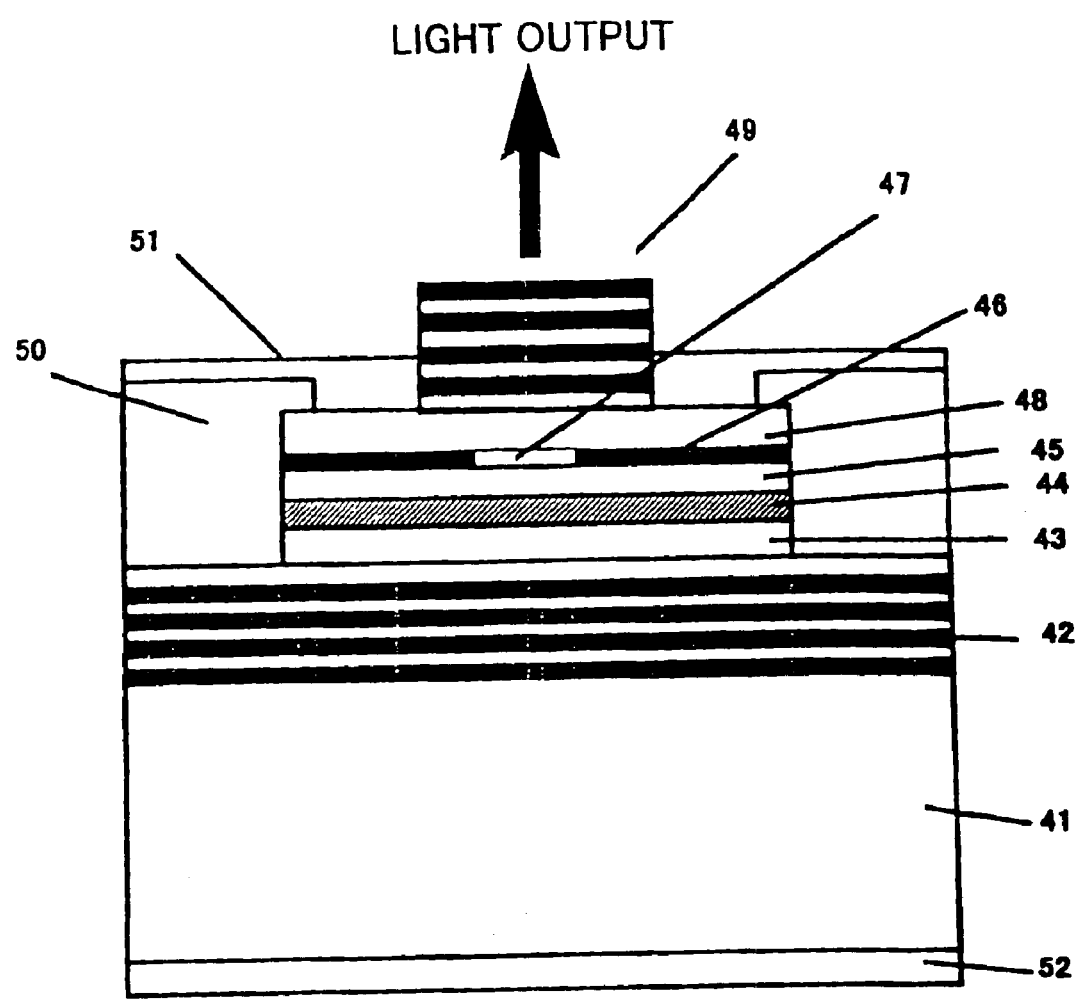
FIG. 11 is a cross sectional view of another embodiment of the light emitting device disclosed herein, in which the light emitting device is a vertical cavity surface emitting laser.

A light emitting device according to the present invention was fabricated as illustrated in FIG. 11. The device was a vertical cavity surface emitting laser (VCSEL).

In order to form an optical cavity for light emission, the VCSEL device comprised a substrate 41, a lower mirror region or reflector 42 adjacent to the substrate, a quantum well active region 44, and an upper mirror region 49 on the opposite side of the active region from the lower mirror region or reflector 42.

The quantum well active region 44 was thus sandwiched between the lower and upper mirror regions. Of these mirror regions, at least the lower 42 was constructed in the present embodiment to have a periodic multi-layered structure of thin semiconductor layers with alternating higher and lower refractive indices, in which these thin semiconductor layers were characterized as to contain no Al. The active region 44, the lower mirror region 42 and the upper mirror region 49 collectively constituted the optical cavity for the laser light emission.

More specifically, referring to FIG. 11, the VCSEL device was formed on a (100) n-GaAs substrate 41 with the following layers grown contiguously thereon, in the order recited:

35 periods of a quarter-wavelength stack of alternating n-$Ga_{0.5}In_{0.5}P$ and n-GaAs layers, which were lattice-matched to the GaAs substrate 41, each having a physical thickness of $\bar{e}/4n$, where n is the refractive index of the material of the layer, to thereby form an n-type semiconductor (or lower GaInP/GaAs) multi-layered reflector 42, a GaAs spacer layer 43, a GaInNAs/GaAs multi-quantum well active region 44 including three $Ga_{0.6}In_{0.4}N_{0.05}As_{0.995}$ and GaAs barrier layers which were interposed therebetween and having a thickness of 13 nm;

a GaAs spacer layer 45, an $Al_xO_y$ current confinement layer 46, a p-AlAs current inlet portion 47 having a thickness of 50 nm, a p-GaAs contact layer 48 having a thickness of 0.3 micron, and 30 periods of a quarter-wavelength stack of alternating p-$Ga_{0.5}In_{0.5}P$ and p-GaAs layers, which were lattice-matched to the GaAs substrate 41, to thereby form a p-type semiconductor (or upper GaInP/GaAs) multi-layered reflector 49.

Further provided were a polyamide dielectric film 50 flanking the side faces of the GaAs spacer layer 43, the quantum well active region 44, the GaAs spacer layer 45, the current confinement layer 46, and the p-GaAs contact layer 48; a positive electrode 51 formed on the p-GaAs contact layer 48, and a negative electrode 52 formed on the rear side of the n-GaAs substrate 41.

The growth of the compositional layers was carried out on a GaAs substrate as follows.

A (100) n-GaAs substrate 41 was chosen for the growth and subsequent layers were grown contiguously thereon. First, 35 periods of a quarter-wavelength stack of alternating n-$Ga_{0.5}In_{0.5}P$ and n-GaAs layers, which were lattice-matched to the GaAs substrate 41, to thereby form the n-type semiconductor (or lower GaInP/GaAs) multi-layered reflector 42; second, a GaAs spacer layer 43, subsequently, a GaInNAs/GaAs multi-quantum well active region 44, including three $Ga_{0.6}In_{0.4}N_{0.05}As_{0.995}$ and GaAs barrier layers which were interposed therebetween and having a thickness of 13 nm; a GaAs spacer layer 45, an $Al_xO_y$ current confinement layer 46, a p-AlAs current inlet portion 47 having a thickness of 50 nm, a p-GaAs contact layer 48 having a thickness of 0.3 micron, and 30 periods of a quarter-wavelength stack of alternating p-$Ga_{0.5}In_{0.5}P$ and p-GaAs layers, which were lattice-matched to the GaAs substrate 41, to thereby form a p-type semiconductor (or upper GaInP/GaAs) multi-layered reflector 49.

In the present embodiment, the In content, x, and N content in the quantum well layers were chosen as 40% and 0.5%, respectively, and the thickness of these well layers was 7 nm. It is noted that these thickness values exceed the critical thickness $h_c$ of approximately 6.1 nm obtained by the aforementioned relationship of Matthews and Blakeslee.

The amount of compressive strain for these layers was found to be approximately 2.7%. The compositional layers were grown by MOCVD, using source materials such as TMG, TMI, $AsH_3$ and $PH_3$, while DMHy was used as the N source.

DMHy has a relatively low dissociation temperature and high vapor pressure, to thereby preferably be used as the N source materials for the layer growth at low temperatures as low as below 600° C. This is especially useful for the growth of quantum well layers formed with large strains, for which the growth temperatures are preferably as low as possible ranging from 500° to 600° C. In the present embodiment, the GaInNAs layers were grown at 540° C. In addition, hydrogen was used as the carrier gas.

The thus formed structure was subjected to mesa etching processes using known photolithographic masking and etching techniques, in which portions on top of the lower multi-layered reflector 42 was first mesa etched to form a cylinder with a diameter of approximately 30 microns and which only portions of the upper multi-layered reflector 49 were further mesa etched to form another cylinder having a diameter of approximately 10 microns (FIG. 11). In addition, the current confinement layer 46 was formed by oxidizing the AlAs layer with water vapor laterally from the exposed side portions thereof.

Subsequently, these etched portions were leveled with polyamide dielectric 50, then portions thereof were removed, at which both the positive electrode 51 and the upper multi-layered reflector 49 which served as a light emission port were to be formed. The positive electrode 51 was formed subsequently on the p-GaAs contact layer 48, while the negative electrode 52 was formed on the rear side of the n-GaAs substrate 41.

As described earlier, the thin alternating layers in the lower n-type semiconductor reflector 42 of the VCSEL device of FIG. 11, were formed with no Al content, such as with GaInP and GaAs layers, provided between the substrate 41 and quantum well active region 44. As a result, the active layers in the region 44 were successfully grown with more ease without decreasing crystallinity in spite of large strains induced in these layers.

The above-mentioned combination of the alternating layers was chosen based on low and high reflectivity values of GaInP and GaAs, respectively. Other combinations may also be used for the alternating layer formation, such as GaInPAs (low reflectivity) and GaAs (high reflectivity), GaInP (low) and GaInPAs (high), GaInP (low) and GaPAs (high), GaInP (low) and GaInAs (high), and GaInP (low) and GaInNAs (high).

In addition, the upper p-type semiconductor reflector 49 of the VCSEL device, which is provided above the active layer regions 44, may be formed in a similar manner to the lower reflector 42, in which thin alternating layers were formed also with no Al content and in combination of layers having low and high reflectivity values. The combination may include GaInP (low reflectivity) and GaAs (high reflectivity), GaInPAs (low) and GaAs(high), GaInP (low) and GaInPAs (high), GaInP (low) and GaPAs (high), GaInP (low) and GaInAs (high), and GaInP (low) and GaInNAs (high).

Furthermore, the upper p-type semiconductor reflector 49 which is provided above the active layer regions 44, may alternately be formed with Al containing layers. Specific examples of such Al containing layers include those of AlAs (low reflectivity) and GaAs (high reflectivity), AlGaAs and GaAs, AlAs and AlGaAs, and AlGaAs having a higher Al content and AlGaAs having a lower Al content.

Since the active layers 44 for forming the VCSEL device with large strains were formed at low temperatures as stated earlier, it is preferable the reflector layers be grown at temperatures as low as possible such as, for example, less than or equal to 700° C.

In addition, the upper reflector 49 may also have a multi-layered dielectric structure with alternating refractive indices. Specific example of the structure include the combination of $TiO_2$ and $SiO_2$.

When emission spectra from the thus fabricated VCSEL were measured at room temperature, the spectra were found to have a peak wavelength at approximately 1.3 micron. In addition, threshold current density $J_{th}$ values of the device were obtained as approximately 1 $kA/cm^2$.

In the device according to the present embodiment, the In content of larger than 30% and compressive strain of at least 2% have been achieved. As a result, N content has decreased from previous values with $J_{th}$ values decreased considerably, thereby achieving excellent high temperature characteristics and improved durability of the VCSEL device.

Although the growth method of the compositional layers for the device was referred to the case with MOCVD in this embodiment, other methods may also be used alternatively such as MBE and other similar methods.

In addition, although the growth of the layers was described using DMHy as the N source material, other materials may alternatively be used such as activated N species, $NH_3$ and other appropriate N containing materials.

In addition, although the structure of the active layer was referred to the case with a triple quantum well (TQW), other structures may alternately be adopted, including other numbers of quantum wells such as, for example, single-quantum well (SQW) and multi-quantum wells (MQW).

Further, the respective thickness of the compositional layers is not limited to that described above, but other thickness may also be adopted for forming the laser structure, when relevant. In addition, the active layer 44 may alternately be composed of GaInAs, and laser structures may also appropriately be adopted other than those described above in this embodiment.

Example 6

Figure 12:
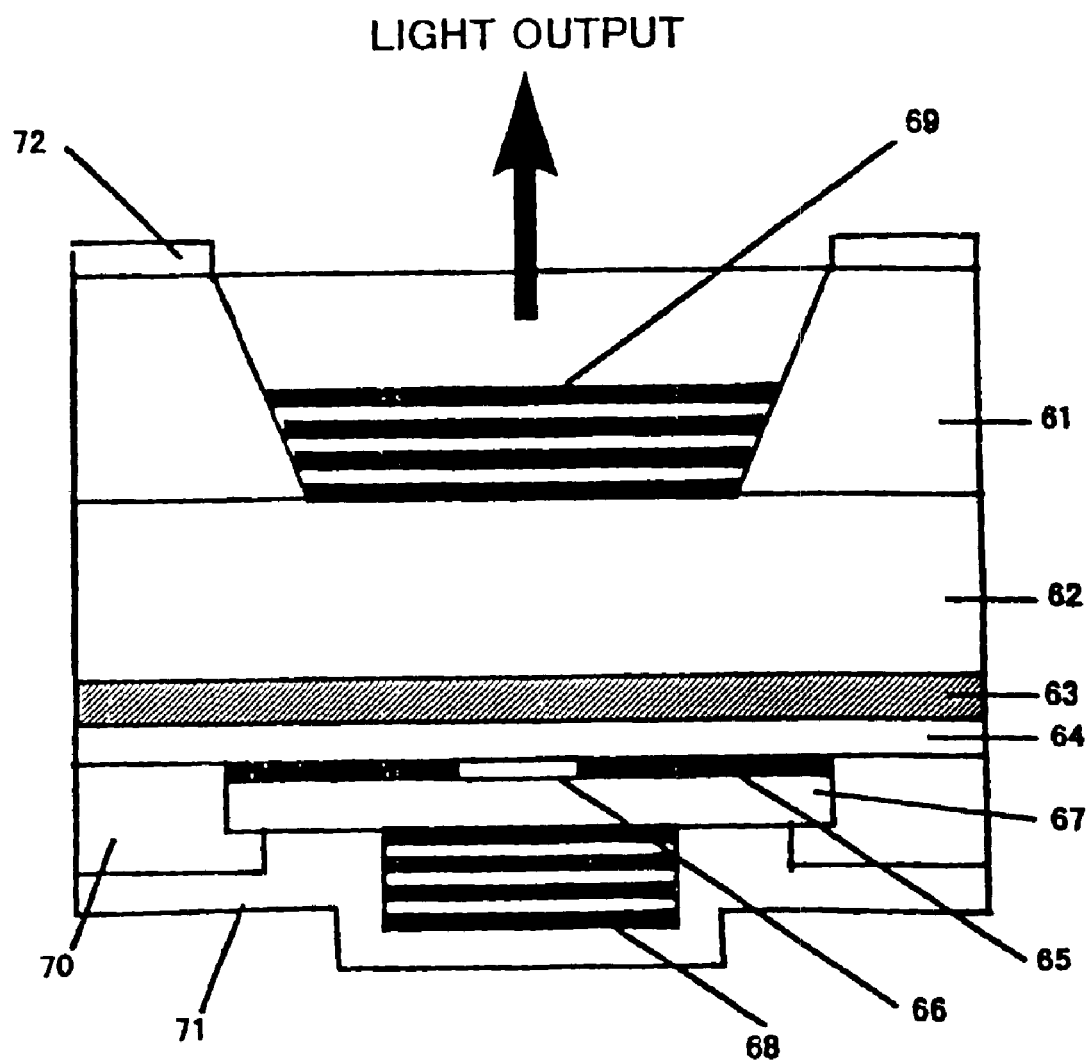
FIG. 12 is a cross sectional view of another embodiment of the light emitting device disclosed herein, in which the light emitting device is a further vertical cavity surface emitting laser.

A light emitting device according to the present invention was fabricated as illustrated in FIG. 12. The device was a further vertical cavity surface emitting laser (VCSEL).

In order to form an optical cavity for light emission, the VCSEL device comprised a substrate 61, a lower mirror region or reflector 69 adjacent to the substrate, a quantum well active region 63, and an upper mirror region 68 on the opposite side of the active region from the lower mirror region or reflector 69.

The quantum well active region 63 was thus sandwiched between the lower and upper mirror regions. Of these mirror regions, at least the lower 69 was constructed in the present embodiment to have a periodic multi-layered structure of thin dielectric layers with alternating higher and lower refractive indices.

The active region 63, the lower mirror region 69 and the upper mirror region 68 collectively constituted the optical cavity for the laser light emission.

More specifically, referring to FIG. 12, the VCSEL device was formed on a (100) n-GaAs substrate 61 with the following layers grown contiguously thereon, in the order recited:

an n-GaInPAs cladding layer 62 lattice-matched to the GaAs substrate 61, having a thickness of 0.5 micron, a GaInNAs/GaAs multi-quantum well active region 63 including three $Ga_{0.6}In_{0.4}N_{0.05}As_{0.995}$ quantum well layers and GaAs barrier layers, a p-GaInPAs cladding layer 64 having a thickness of 1.5 micron, an $Al_xO_y$ current confinement layer 65, an AlAs layer 66 serving a current inlet portion, having a thickness of 50 nm, a p-GaAs contact layer 67 having a thickness of 0.3 micron, 21 periods of a quarter-wavelength stack of alternating p-AlGaAs and p-GaAs layers, each having a physical thickness of $\bar{e}/4n$, where n is the refractive index of the material of the layer, to thereby form an upper p-type AlGaAs/GaAs semiconductor multi-layered reflector 68.

In addition, portions of the GaAs substrate 61 was etched down to the top face of the cladding layer 62, into which the above-mentioned lower $TiO_2/SiO_2$ dielectric multi-layered reflector 69 is formed.

Further provided were a polyamide dielectric film 70 flanking the side faces of the $Al_xO_y$ layer 65 and the p-GaAs contact layer 67, a positive electrode 71 formed on the p-GaAs contact layer 67, and a negative electrode 72 formed on the rear side of the GaAs substrate 61.

The growth of the compositional layers was carried out on a GaAs substrate as follows.

A (100) n-GaAs substrate was chosen for the growth and subsequent layers were grown contiguously thereon. First, an n-GaInPAs cladding layer 62 lattice-matched to the GaAs substrate 61, having a thickness of 0.5 micron; second, a GaInNAs/GaAs multi-quantum well active region 63 including three $Ga_{0.6}In_{0.4}N_{0.05}As_{0.995}$ quantum well layers and GaAs barrier layers, subsequently, a p-GaInPAs cladding layer 64 having a thickness of 1.5 micron, an $Al_xO_y$ current confinement layer 65, an AlAs layer 66 as a current inlet portion, having a thickness of 50 nm; a p-GaAs contact layer 67 having a thickness of 0.3 micron, 21 periods of a quarter-wavelength stack of alternating p-AlGaAs and p-GaAs layers, each having a physical thickness of $\bar{e}/4n$, where n is the refractive index of the material of the layer, to thereby form an upper p-type AlGaAs/GaAs semiconductor multi-layered reflector 68.

In the present embodiment, the In content, x, and N content in the quantum well layers were chosen as 40% and 0.5%, respectively, and the thickness of these well layers was 7 nm. The amount of compressive strain for these layers was found to be approximately 2.7%. The compositional layers were grown by MOCVD, using source materials such as TMG, TMI, $AsH_3$ and $PH_3$, while DMHy was used as the N source. In addition, Al containing layers in the p-type semiconductor multi-layered reflector 68 were grown at low temperature such as 680° C. so as to reduce the effect on the active region 63, if any.

The thus formed structure was subjected to mesa etching processes using known photolithographic masking and etching techniques, in which surface portions on top of the upper mirror region 68 was first mesa etched to form a cylinder with a diameter of approximately 10 microns and which the p-GaAs contact layer 67 was further mesa etched to form another cylinder having a diameter of approximately 30 microns. There carried out subsequently were coating with a polyamide dielectric layer 70, making a current inlet 66, and providing a p-electrode 71.

On the opposite side of the structure, other etching processes were carried out, in which surface portions of the GaAs substrate 61 was first mesa etched down to the surface of the p-GaInPAs cladding layer 64 and the dielectric (or lower $TiO_2/SiO_2$) multi-layered reflector 69 was formed into the thus formed etched portion.

Subsequently, a negative electrode 72 was provided on the rear side of the GaAs substrate 61. In this device structure, emissions from the laser device are extracted from the rear side of the GaAs substrate as shown in FIG. 12.

It is noted that, in this embodiment, a semiconductor multi-layered reflector was not interposed between the GaAs substrate 61 and the quantum well active region 63 which have been formed preferably to have large strains. Rather, the dielectric multi-layered reflector was formed on the side of the GaAs substrate 61. As a result, the quantum well active region 63 was able to be grown with relative ease without any reduction in device characteristics.

In other words, a semiconductor layered reflector was formed on the other side of the active region from the substrate. Since no Al-containing layer was present between the substrate and active region which was formed to have large strains, excellent surface quality of the active layers during the growth can be achieved, thereby yielding satisfactory growth of the quantum well active region with relative ease in spite of large strains.

When emission spectra from the thus fabricated VCSEL were measured at room temperature, the spectra were observed to have a peak wavelength at approximately 1.3 micron. In addition, threshold current density $J_{th}$ values of the device were found as approximately 1 $kA/cm^2$.

In the device according to the present embodiment, the In content of larger than 30% and compressive strain of at least 2% have been achieved. As a result, N content has decreased from previous values and the $J_{th}$ values have also decreased considerably, thereby achieving excellent high temperature characteristics and improved durability of the VCSEL device.

Although the growth method of the compositional layers for the device was referred to the case with MOCVD in this embodiment, other methods may also be used alternatively such as MBE and other similar methods.

In addition, although the growth of the layers was described using DMHy as the N source material, other materials may alternatively be used such as activated N species, $NH_3$ and other appropriate N containing materials.

Further, although the structure of the active layer was referred to the case with a triple quantum well (TQW), other structures may alternately be adopted, including other numbers of quantum wells such as, for example, single-quantum well (SQW) and multi-quantum wells (MQW).

Still further, the respective thickness of the compositional layers is not limited to that described above, but other thicknesses may also be adopted for forming the laser structure, when relevant. In addition, the active layer 63 may alternately be composed of GaInAs, and laser structures may also appropriately be adopted other than those described above in this embodiment.

The quality of the active layers mentioned above are generally quite sensitive to layer structure and growth conditions such as described throughout the present description. Although the above discussion has therefore been concentrated rather in these points, it may be noted that these point on the structure and growth conditions in the present embodiment are effective also for the system having strains of 2% or less.

Furthermore, although GaInAs and GaInNAs were chosen and discussed as the semiconductor material which were used in compositional layers formed on the GaAs substrate in the embodiments, other materials may also be adopted, such as, for example, GaInP and GaPAs with the GaAs substrate; and GaInAs, GaInPAs, InPAs and InNPAs with the InP substrate.

Namely, the present invention may appropriately adopted to semiconductor devices with the combination of semiconductor materials used for the light emitting active layer and substrate, in which the lattice constant is considerably different from each other.

In addition, the present invention may be adopted also to semiconductor devices used for the light emitting active layer and substrate, in which the lattice constant is considerably different from each other.

Furthermore, the present invention may be adopted also to other semiconductor devices incorporating III–V alloy semiconductor structures for use in other light emitting device than described herein above, and also photodetectors.

Example 7

A method of forming III–V semiconductor alloy layers is disclosed. The III–V semiconductor alloy layers contain at least Al as one group-III element and both N and As as group-V elements, and the method includes the step of forming the III–V alloy semiconductor layers for fabricating a light emitting device, wherein the III–V alloy semiconductor layers were composed of AlGaInNAs.

Figure 13:
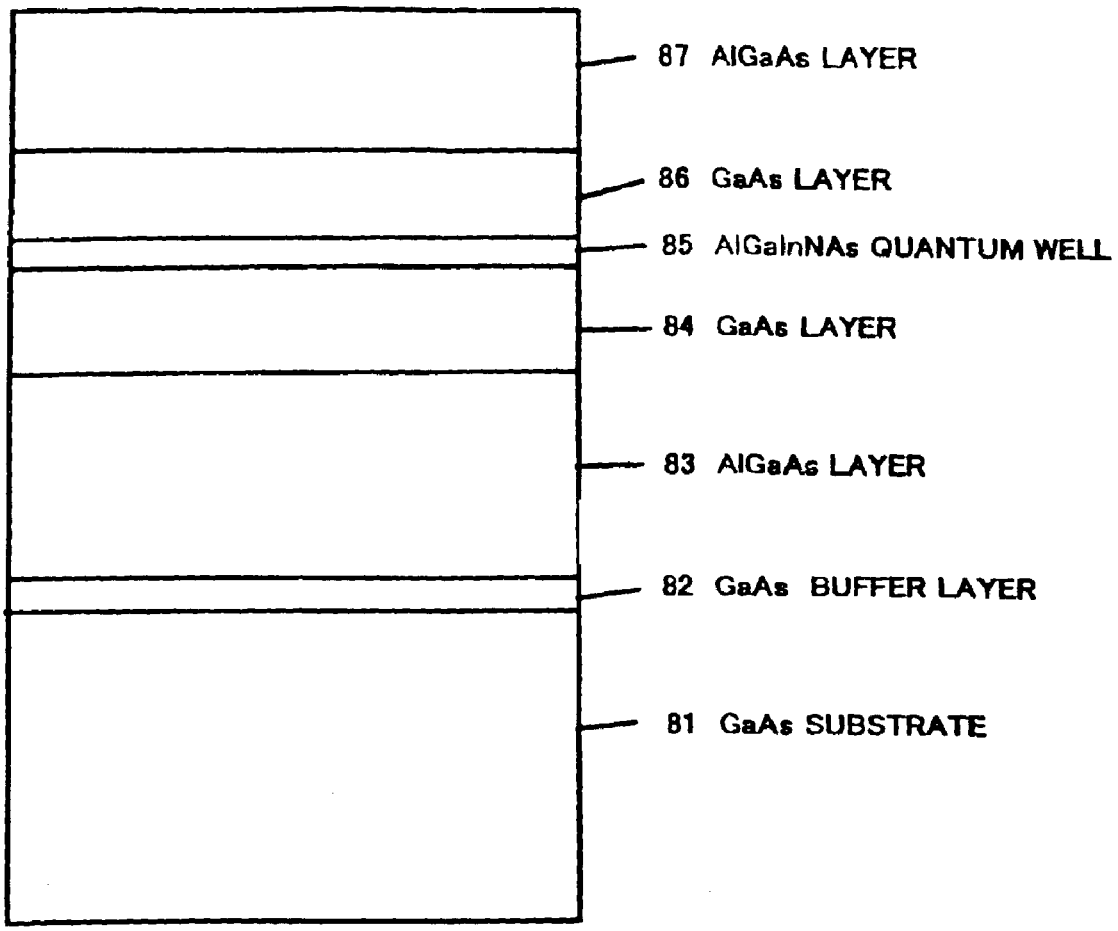
FIGS. 13–16 are cross sectional views of other embodiments of the light emitting device disclosed herein.

Referring to FIG. 13, the light emitting device was formed on a GaAs substrate 81 with the following layers grown contiguously thereon, in the order recited: A GaAs buffer layer 82, an AlGaAs layer 83, a GaAs layer 84, an AlGaInNAs quantum well layer 85 having compressive strains, a GaAs layer 86, and a AlGaAs layer 87.

These compositional layers for forming the light emitting device were grown by MOCVD, using source materials such as, TMA, TMG and TMI.

For carrying out the growth of alloy semiconductors in accordance with the present invention, a reactor (not shown) of an MOCVD apparatus is used.

The reactor comprised a quartz tube which was operable as a reactor, equipped with a water cooling system around the outer face of the tube, an inlet for feeding gaseous components such as source materials and carrier gas, a substrate placed on a carbon susceptor, a heating coil supplied with high frequency power to heat the carbon susceptor with the substrate, a thermocouple to monitor temperatures of the carbon susceptor and the substrate, and an evacuation system to evacuate to and/or maintain an appropriate low pressure. By the use of this apparatus and MOCVD method, growth of alloy semiconductors were carried out.

In the reactor, the GaAs substrate 81 was placed on the carbon susceptor with a thermocouple attached thereto for monitoring temperatures, and heated to, and controlled at, a predetermined temperature by the heating coil supplied with high frequency power. Source materials and the carrier gas were introduced simultaneously into the reactor through the inlet.

The growth of the compositional layers was then carried out on the GaAs substrate 11 in the order recited: A GaAs buffer layer 82, an AlGaAs layer 83, a GaAs layer 84, an AlGaInNAs quantum well layer 85 having compressive strains, a GaAs layer 86, and a AlGaAs layer 87.

The source material used in the growth of these compositional layers for forming the light emitting device were materials such as, TMA, TMG and TMI for group-III elements; AsH$_3$ for arsenic, DMHy for nitrogen, while hydrogen was used as the carrier gas.

When source materials and the carrier gas were introduced simultaneously into the reactor through the inlet, the compositional crystalline layers were deposited on the GaAs substrate 81 through the thermal dissociation of the source materials and their reaction with the surface of the GaAs substrate 81. The AlGaInNAs quantum well layer 85 was grown at 600° C. As a result, the III–V semiconductor alloy layers were grown including the AlGaInNAs quantum well layer 85, having a thickness of 7 nm.

The respective thicknesses of other compositional layers are 0.2 micron for the AlGaAs layer 83, 0.1 micron for the GaAs layer 84, 50 nm for the GaAs layer 86, and 50 nm for the AlGaAs layer 87.

When emission spectra from the thus formed AlGaInNAs quantum well layer 85 were measured at room temperature, the spectra were found to have a peak wavelength longer than that for GaInNAs formed under approximately the same conditions. This is considered to be due to the inclusion of a larger amount of N, caused by the strong bonding between Al and N.

The N content in this AlGaInNAs quantum well layer 85 was found to increase with the increase of the feeding ratio, DMHy to AsH$_3$, the decrease in the growth temperature, and/or the increase in the growth rate.

In addition, the N content in the AlGaInNAs quantum well layer 85 was increased with the increase of the Al content, and the rate of N inclusion was considerably increased by the addition of a relatively small amount of Al.

With the inclusion of Al as a group-III element and N and As as group-V elements, N inclusion is considerably increased and the layer growth can be conveniently carried out under a wider range of conditions to be optimized for the layer growth, such as, for example, the growth temperature and feeding rate of source gasses.

Namely, the bonding is stronger between Ga and N than between In and N, the efficiency of N inclusion in GaInNAs increases with the increase of Ga content. In addition, Al is quite active chemically, the bonding between Al and N is stronger than that between Ga and N. Therefore, by including Al as one group-III element in a III–V semiconductor alloy which contains N and at least one of other group-V elements, the rate of N inclusion can increase considerably.

Although the rate of this N inclusion increases with the increase in the Al content as one group-III element, even a small amount of Al is quite effective for the increase. The N containing III–V semiconductor alloy is therefore obtained with relative ease having excellent crystalline quality.

The semiconductor structure is composed specifically of either Al$_x$Ga$_y$In$_{1-x-y}$N$_z$As$_{1-z}$ (0<x<1, 0<y<1) or Al$_x$In$_{1-x}$N$_y$P$_z$As$_{1-y-z}$ (0<x<1, 0<y<1, 0≦z<1) in the present embodiment. With this structure, the inclusion of N into either GaInNAs or InNPAs is achieved by the above-mentioned Al addition, thereby resulting in excellent crystalline quality. This makes an improvement feasible for the GaInNAs and InNPAs systems, which have been suffered from degrading the crystalline quality in spite of their excellent capability for use in the field of optical communications.

Further, by this Al inclusion of a small amount, the layer growth has become feasible under a wider range of conditions to be optimized for the layer growth, such as, for example, the growth temperature and feeding rate of source gasses.

Namely, GaInNAs is the form of mixed crystals of GaInAs and GaInN. The former has a lattice constant larger than GaAs, while the latter has a lattice constant smaller than GaAs. When the GaInNAs is formed by adding N into GaInAs, the lattice constant decreases, to thereby be lattice-matched to GaAs layers 84 and 86. Since N has a larger electronegativity than other elements, band gap energy of the GaInNAs layers further decreases. As a result, light emissions at the wavelength region of 1.3 μm or 1.5 μm may become feasible in the devices using the GaInNAs material.

However, the rate of the N inclusion with respect to the amount of As is rather small. In addition, this rate is dependent on the In content and decreases with the increase in the In content.

However, since the bonding between Al and N is stronger than either between Ga and N or between In and N, the rate of N inclusion can be increased by adding Al.

In the present embodiment, the N inclusion in GaInNAs has been increased by the Al addition, to thereby yield alloy crystals having a large N content with relative ease.

Although the growth method of the compositional layers for forming the light emitting device was referred to the case with MOCVD in this example, other methods may also be used alternatively such as MBE and other similar methods.

In addition, although the growth of the layers was described using DMHy as the N source material in the example, other materials may alternatively be used such as activated N species, NH$_3$ and other appropriate N containing materials.

Furthermore, in the present embodiment, although the growth method was referred to the case of AlGaInNAs as III–V semiconductor alloy layers, comprising Al as a group-III element and both N and As as group-V elements, this method can be applied also to AlInNPAs on an InP substrate, as III–V semiconductor alloy layers, comprising both N and other group-V elements.

Furthermore, the present invention may be adopted also to other semiconductor devices incorporating III–V alloy semiconductor structures which comprise both N and other group-V elements and are composed of AlGaInNAs and AlInNPAs, for use in other light emitting devices than described earlier, and photodetectors.

Example 8

Figure 14:
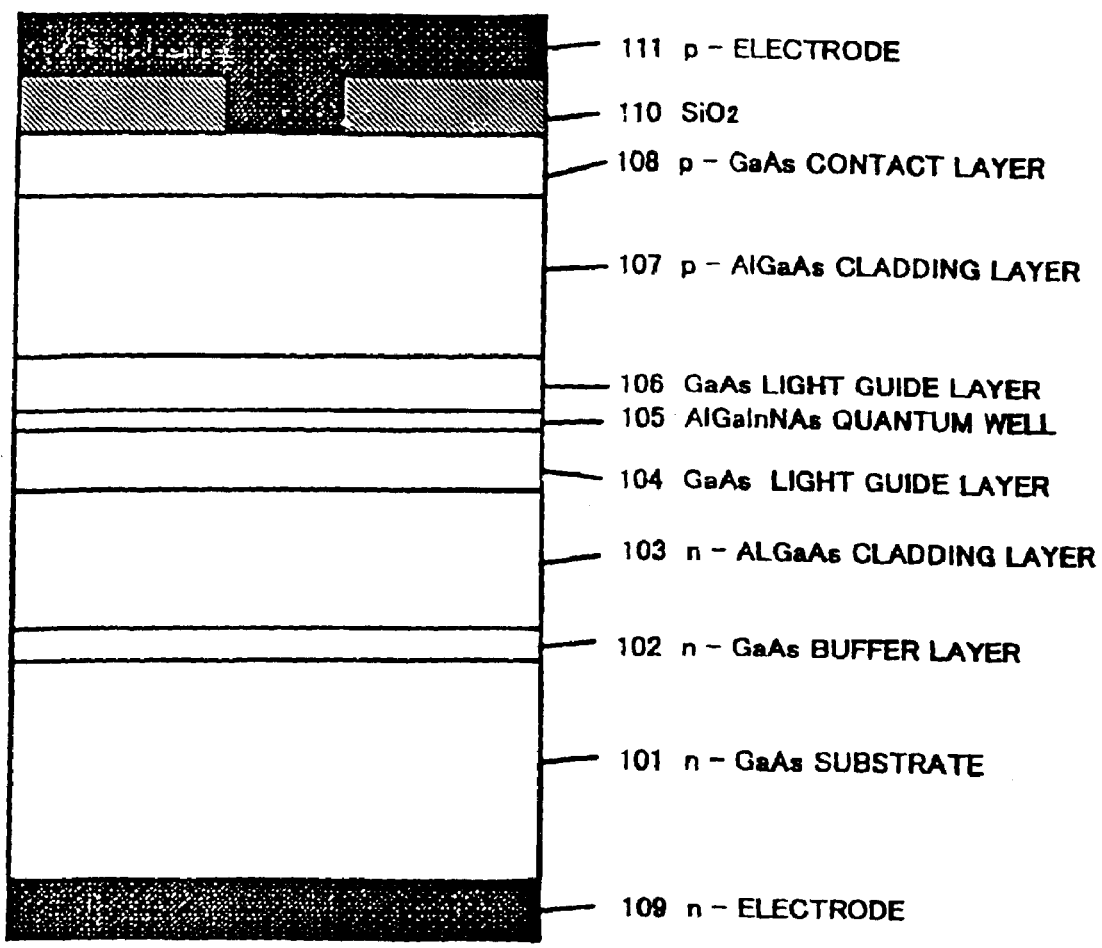

A light emitting device was fabricated as illustrated in FIG. 14 according to the present invention. The device was a dielectric-stripe laser incorporating an AlGaInNAs quantum well structure serving as an active layer.

Referring to FIG. 14, the light emitting device was formed on an n-GaAs substrate 101 with the following layers grown contiguously thereon, in the order recited:

an n-GaAs buffer layer 102, an n-Al$_{0.4}$Ga$_{0.6}$As lower cladding layer 103, a GaAs lower light guide layer 104, an Al$_{0.03}$Ga$_{0.67}$In$_{0.3}$N$_{0.01}$As$_{0.99}$ quantum well layer 105 having photoemission at 1.3 micron, a GaAs upper light guide layer 106, a p-Al$_{0.4}$Ga$_{0.6}$As upper cladding layer 107, and a p-GaAs contact layer 108.

Subsequently, an SiO$_2$ dielectric layer 110 was disposed on the contact layer 108, a portion of which was removed to form a current inlet. A positive electrode 111 was then provided over the removed portion of the contact layer 108, while a negative electrode 109 was provided on the rear side of the GaAs substrate 101.

These compositional layers for forming the dielectric-stripe laser were grown by MOCVD, using source materials such as, TMA, TMG, and TMI for group-III elements; $AsH_3$ for arsenic, DMHy for nitrogen, while hydrogen was used as the carrier gas. In addition, the laser device was fabricated to have an SCH-SQW (separate confinement heterostructure with a single quantum well) structure.

The aforementioned reactor of the MOCVD apparatus was used for the growth of the compositional layers. In the reactor, the GaAs substrate was placed on the carbon susceptor with a thermocouple attached for monitoring temperatures, and heated to, and controlled at, a predetermined temperature by the heating coil supplied with high frequency power. Source materials and the carrier gas were introduced simultaneously into the reactor through the inlet.

The growth of the compositional layers was then carried out on the GaAs substrate 101 in the order recited: n-GaAs buffer layer 102, the n-$Al_{0.4}Ga_{0.6}As$ lower cladding layer 103, GaAs light guide layer 104, $Al_{0.03}Ga_{0.67}In_{0.3}N_{0.01}As_{0.99}$ quantum well layer 105, GaAs light guide layer 106, p-$Al_{0.4}Ga_{0.6}As$ upper cladding layer 107, and p-GaAs contact layer 108.

Subsequently, the negative electrode 109 was provided on the rear side of the GaAs substrate 101. In addition, a dielectric layer 110 which was composed of $SiO_2$, for example, was formed on the contact layer 108, a portion of which was removed to form a current inlet. The positive electrode 111 was then provided over the portion of the contact layer 108.

The respective thicknesses of the compositional layers were 1.5 micron for the lower cladding layer 103, 120 nm for the GaAs light guide layer 104, 7 nm for the $Al_{0.03}Ga_{0.67}In_{0.3}N_{0.01}As_{0.99}$ quantum well layer 105, 120 nm for the GaAs light guide layer 106, 1.5 microns for the p-$Al_{0.4}Ga_{0.6}As$ upper cladding layer 107, and 0.3 micron for the p-GaAs contact layer 108. In addition, the resultant $Al_{0.03}Ga_{0.67}In_{0.3}N_{0.01}As_{0.99}$ quantum well layer 105 was found to have a compressive strain of approximately 2%.

In this embodiment, the $Al_{0.03}Ga_{0.67}In_{0.3}N_{0.01}As_{0.99}$ quantum well layer 105 was grown at 600° C. It has been found during the growth that the rate of N inclusion is considerably increased in the $Al_{0.03}Ga_{0.67}In_{0.3}N_{0.01}As_{0.99}$ quantum well layer than the GaInNAs layer and the supplying ratio of DMHy to $AsH_3$ can be decreased. This increase in the rate of N inclusion is considered to result from the addition of a relatively small amount of Al, thereby facilitating the inclusion of N element into the compositional layers.

As a result, the issue of N addition is not necessarily of primary concern for achieving satisfactory quality of resulting layers, as has been the case previously, but the layer growth can be carried out possibly under a wider range of conditions to be optimized for the layer growth, such as, for example, the growth temperature and feeding rate of source gasses.

Therefore, the dielectric-stripe laser can be fabricated having improved characteristics, incorporating an $Al_{0.03}Ga_{0.67}In_{0.3}N_{0.01}As_{0.99}$ quantum well 105 of an excellent crystallinity.

When emission spectra from the thus fabricated dielectric-stripe laser were measured at room temperature, the spectra were observed to have a peak wavelength at approximately 1.3 micron which is useful for optical communications. In addition, the device was found to have improved high temperature characteristics over previous GaInPAs/InP laser devices.

As described above, serving as the active layer of the laser device of the present embodiment, the $Al_{0.03}Ga_{0.67}In_{0.3}N_{0.01}As_{0.99}$ quantum well 105 is of a III–V semiconductor alloy, comprising Al as a group-III element and both N and As as group-V elements simultaneously.

Since a heterojunction can be formed between the above-mentioned III–V semiconductor alloy layer (the quantum well 105) and a contiguous cladding layer, a conduction band discontinuity may be formed with sufficient magnitude for preventing overflow of injected carriers (electrons) from the active layer to the cladding layer. This may give rise to improved device characteristics especially at high temperatures.

In addition, as described above, the rate of N inclusion is increased by adding Al and thereby facilitating the inclusion of N element into the compositional layers during the growth, and the layer growth can be carried out under a wider range of conditions to optimize for the layer growth, such as, for example, temperature and feeding rate of source gasses. This facilitates the growth of compositional layers with improved crystalline quality of the layers and device characteristics of the dielectric-stripe laser.

Although the growth method of the compositional layers for forming the dielectric-stripe laser was referred to the case with MOCVD in this example, other methods may also be used alternatively such as MBE and other similar methods.

In addition, although the growth of the layers was described using DMHy as the N source material in the example, other materials may alternatively be used such as activated N species, $NH_3$ and other appropriate N compounds.

Furthermore, although the structure of the active layer in the dielectric-stripe laser of the present example was referred to the case with a single quantum well (SQW), other structures may also be adopted, including such as, for example, multi-quantum wells (MQW) and known double-hetero (DH) junctions.

Still further, the respective thicknesses of the compositional layers is not limited to that described above, but other thicknesses may be adopted for forming the laser structure, when relevant. In addition, laser structures may also appropriately be adopted other than those described above, and the cladding layers 103,107 may be alternatively formed of the GaInP(As) systems.

Example 9

Figure 15:
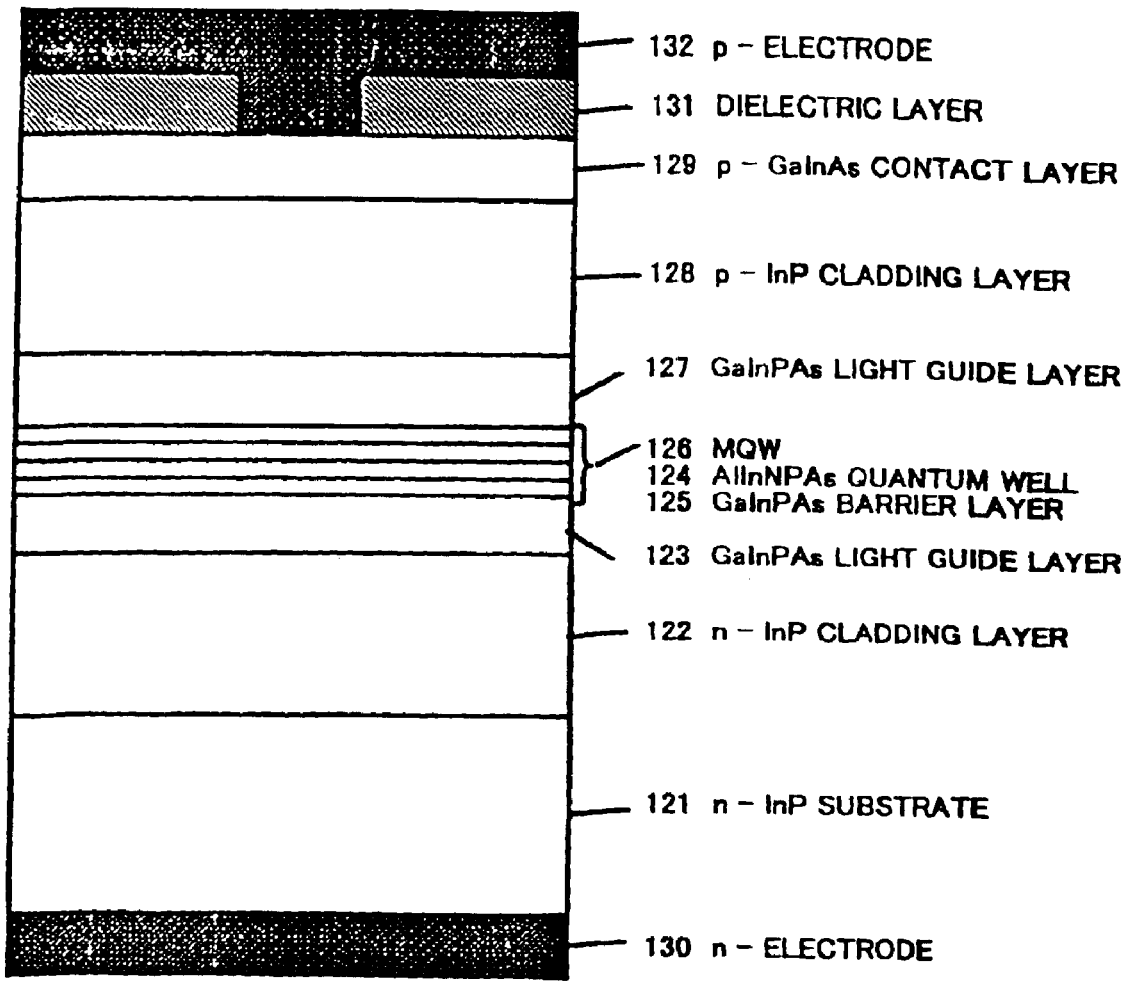

A light emitting device was constructed as illustrated in FIG. 15 according to the present invention. The device was a dielectric-stripe laser incorporating an AlInNPAs quantum well structure serving as an active layer.

Referring to FIG. 15, the light emitting device was formed on an n-InP substrate 121 with the following layers grown contiguously thereon, in the order recited:

an n-InP lower cladding layer 122, a GaInPAs light guide layer 123,

MQW layers 126 including two or more $Al_{0.03}In_{0.97}N_{0.01}P_{0.55}As_{0.44}$ quantum well layers 124 having light emissions at 1.3 micron and GaInPAs barrier layers 125 interposed therebetween, a GaInPAs light guide layer 127, a p-InP upper cladding layer 128, and a p-GaInAs contact layer 129.

Subsequently, a dielectric layer 131 was disposed on the p-GaInAs contact layer 129, a portion of which was removed to form a current inlet. A positive electrode 132 was then provided over the removed portion of the contact layer 129, while a negative electrode 130 was provided on the rear side of the n-InP substrate 121.

These compositional layers for forming the dielectric-stripe laser were grown by MOCVD, using source materials such as, TMA, TMG, and TMI for group-III elements; $AsH_3$ for arsenic, DMHy for nitrogen, while hydrogen was used as the carrier gas. In addition, the laser device was fabricated to have an SCH-SQW (separate confinement heterostructure with a single quantum well) structure.

The aforementioned reactor of the MOCVD apparatus was used for the growth of the compositional layers. In the reactor, the InP substrate was placed on a carbon susceptor with a thermocouple attached for monitoring temperatures, and heated to, and controlled at, a predetermined temperature by the heating coil supplied with high frequency power. Source materials and the carrier gas were introduced simultaneously into the reactor through the inlet.

The growth of the compositional layers was then carried out on the InP substrate 121 in the order recited: The n-InP lower cladding layer 122, the GaInPAs light guide layer 123, MQW layers 126 including two or more $Al_{0.03}In_{0.97}N_{0.01}P_{0.55}As_{0.44}$ quantum well layers 124 and GaInPAs barrier layers 125 interposed therebetween, the GaInPAs light guide layer 127, the p-InP upper cladding layer 128, and the p-GaInAs contact layer 129.

Subsequently, the negative electrode 130 was provided on the rear side of the n-InP substrate 121. In addition, a dielectric layer 131 which was composed of $SiO_2$, for example, was formed on the contact layer 129, a portion of which was removed to form a current inlet. The positive electrode 132 was then provided over the portion of the contact layer 129.

The respective thicknesses of the compositional layers were 1.5 micron for the n-InP lower cladding layer 122, 100 nm for GaInPAs light guide layer 123, 6 nm for the $Al_{0.03}In_{0.97}N_{0.01}P_{0.55}As_{0.44}$ quantum well layer 124, 10 nm for the GaInPAs barrier layer 125, 100 nm for the GaInPAs light guide layer 127, 1.5 micron for the p-InP upper cladding layer 128, and 0.3 micron for a p-GaInAs contact layer 129.

It has been found during the layer growth that the rate of N inclusion is considerably increased in the $Al_{0.03}In_{0.97}N_{0.01}P_{0.55}As_{0.44}$ quantum well layers 124 than the InNPAs layer and the supplying ratio of DMHy to $PH_3+AsH_3$ be decreased. The rate of N inclusion is thus increased considerably by adding a small amount of Al, thereby facilitating the inclusion of N element into the compositional layers during the growth.

As a result, the issue of N addition is not necessarily of primary concern for achieving satisfactory quality of resulting layers, but the layer growth can be carried out under a wider range of conditions to be optimized for the layer growth, such as, for example, the growth temperature and feeding rate of source gasses.

Therefore, the dielectric-stripe laser can be fabricated having improved characteristics, incorporating the $Al_{0.03}In_{0.97}N_{0.01}P_{0.55}As_{0.44}$ quantum well layer 124 of an excellent crystallinity.

When emission spectra from the thus fabricated dielectric-stripe laser were measured at room temperature, the spectra were observed to have a peak wavelength at approximately 1.3 micron which is useful for optical communications.

Although the growth method of the compositional layers for forming the dielectric-stripe laser was referred to the case with MOCVD in this example, other methods may be used alternatively such as MBE and other similar methods.

In addition, although the growth of the layers was described using DMHy as the N source material, other materials may be used alternatively such as activated N species, $NH_3$ and other appropriate N compounds.

Furthermore, although the structure of the active layer in the dielectric-stripe laser of the present example was referred to the case with multi-quantum wells (MQW), other structures may also be adopted, including such as, for example, a single quantum well (SQW) and double-hetero (DH) junctions.

Further still, the respective thicknesses of the compositional layers is not limited to that described above, but other thicknesses may be adopted for forming the laser structure, when relevant. In addition, laser structures may also appropriately be adopted other than those described above in the present embodiment.

Example 10

Figure 16:
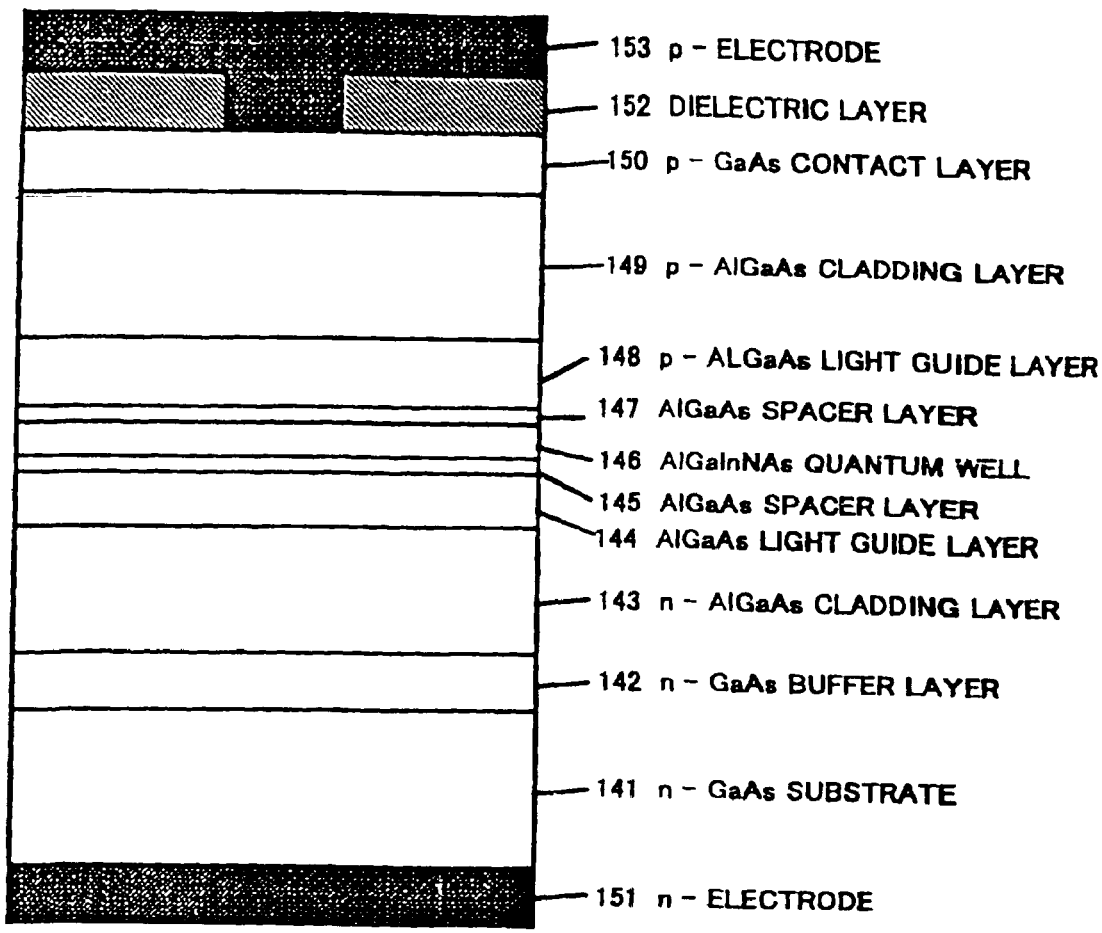

A light emitting device was constructed as illustrated in FIG. 16 according to the present invention. The device was a dielectric-stripe laser incorporating an AlGaInNAs well structure serving as an active layer.

Referring to FIG. 16, the light emitting device was formed on an n-GaAs substrate 141 with the following layers grown contiguously thereon, in the order recited:

an n-GaAs buffer layer 142, an n-$Al_{0.6}Ga_{0.4}As$ lower cladding layer 143, an $Al_{0.1}Ga_{0.98}As$ light guide layer 144, an $Al_{0.02}Ga_{0.98}As$ spacer layer 145, an $Al_{0.03}Ga_{0.67}In_{0.3}N_{0.01}As_{0.99}$ well layer 146, an $Al_{0.02}Ga_{0.98}As$ spacer layer 147, an $Al_{0.1}Ga_{0.9}As$ light guide layer 148, a p-$Al_{0.6}Ga_{0.4}As$ upper cladding layer 149, and a p-GaAs contact layer 150.

Subsequently, a dielectric layer 152 was disposed on the contact layer 150, a portion of which was removed to form a current inlet. A positive electrode 153 was then provided over the removed portion of the contact layer 150, while a negative electrode 151 was provided on the rear side of the GaAs substrate 141.

These compositional layers for forming the dielectric-stripe laser were grown by MOCVD, using source materials such as, TMA, TMG and TMI for group-III elements; $AsH_3$ for arsenic, DMHy for nitrogen, while hydrogen was used as the carrier gas. In addition, the laser device was fabricated to have an SCH-SQW (separate confinement heterostructure with a single quantum well) structure.

The aforementioned reactor of the MOCVD apparatus was used for the growth of the compositional layers. In the reactor, the GaAs substrate was placed on the carbon susceptor with a thermocouple attached for monitoring temperatures, and heated to, and controlled at, a predetermined temperature by the heating coil supplied with high frequency power. Source materials and the carrier gas were introduced simultaneously into the reactor through the inlet.

The growth of the compositional layers was then carried out on the GaAs substrate in the order recited: the GaAs buffer layer 142, $Al_{0.6}Ga_{0.4}As$ lower cladding layer 143; $Al_{0.1}Ga_{0.9}As$ light guide layer 144, $Al_{0.02}Ga_{0.98}As$ spacer layer 145, $Al_{0.03}Ga_{0.67}In_{0.3}N_{0.01}As_{0.99}$ well layer 146, $Al_{0.02}Ga_{0.98}As$ spacer layer 147, $Al_{0.1}Ga_{0.9}As$ light guide layer 148, p-$Al_{0.6}Ga_{0.4}As$ upper cladding layer 149, and p-GaAs contact layer 150.

Subsequently, the negative electrode 151 was provided on the rear side of the GaAs substrate 141. In addition, a dielectric layer 152 which was composed of $SiO_2$, for example, was formed on the contact layer 150, a portion of which was removed to form a current inlet. The positive electrode 153 was then provided over the portion of the contact layer 150.

The respective thicknesses of the compositional layers were 1.5 micron for n-$Al_{0.6}Ga_{0.4}As$ cladding layer 143, 120 nm for $Al_{0.1}Ga_{0.9}As$ light guide layer 144, 2 nm for $Al_{0.02}Ga_{0.98}As$ spacer layer 145, 7 nm for $Al_{0.03}Ga_{0.67}In_{0.3}N_{0.01}As_{0.99}$ well layer 146, 2 nm for $Al_{0.02}Ga_{0.98}As$ spacer layer 147, 120 nm for $Al_{0.6}Ga_{0.9}As$ light guide layer 148, 1.5 micron for p-$Al_{0.6}Ga_{0.4}As$ upper cladding layer 149, and 0.3 micron for p-GaAs contact layer 150. In addition, the resultant $Al_{0.03}Ga_{0.67}In_{0.3}N_{0.01}As_{0.99}$ well layer 146 was found to have a compressive strain of approximately 2%.

In the present device structure shown in FIG. 16, the $Al_{0.03}Ga_{0.67}In_{0.3}N_{0.01}As_{0.99}$ well layer 146 and the $Al_{0.1}Ga_{0.9}As$ light guide layer 144 (or 148) are interposed by the $Al_{0.02}Ga_{0.98}As$ spacer layer 145 (or 147). The $Al_{0.1}Ga_{0.9}As$ light guide layer 144 (or 148) contains more Al, and thereby has a larger bandgap energy, than the well layer 146, while the $Al_{0.02}Ga_{0.98}As$ spacer layer 145 contains less Al than the $Al_{0.03}Ga_{0.67}In_{0.3}N_{0.01}As_{0.99}$ well layer 146. The double-hetero structure resulting from these layers has excellent properties as described hereinbelow.

When the well layer 146 is formed in contact directly with layer containing more Al such as, for example, the light guide layer 144, the interface portion therebetween incorporates more N. This may cause the decrease in crystallinity of the interface portion.

In contrast, in the present layer structure, since the $Al_{0.02}Ga_{0.98}As$ spacer layer 145 (or 147) which contains less Al than the $Al_{0.03}Ga_{0.67}In_{0.3}N_{0.01}As_{0.99}$ well layer 146, is interposed between the $Al_{0.03}Ga_{0.67}In_{0.3}N_{0.01}As_{0.99}$ well layer 146 and the $Al_{0.1}Ga_{0.9}As$ light guide layer 144 (or 148), the interface portion of the former layer 146 does not incorporate excessive N from the light guide layer 144, to thereby result in no decrease in crystallinity. As a result, the aforementioned double-hetero structure is formed with excellent properties and device characteristics of the dielectric-stripe laser can therefore be improved.

As described earlier, since the rate of N inclusion is thus increased considerably by adding a small amount of Al into the well layer 146, the N inclusion into the compositional layers can be carried out with more ease during the growth.

As a result, the issue of N addition is not necessarily of primary concern for achieving satisfactory quality of resulting layers, but the layer growth can be made under a wider range of conditions to be optimized for the layer growth, such as, for example, the growth temperature and feeding rate of source gasses.

Therefore, the dielectric-stripe laser can be fabricated having improved device characteristics, incorporating the $Al_{0.03}Ga_{0.67}In_{0.3}N_{0.03}As_{0.99}$ quantum well layer 146 of an excellent crystallinity.

When emission spectra from the thus fabricated dielectric-stripe laser were measured, the spectra was observed to have its peak wavelength at approximately 1.3 micron which is useful for optical communications.

As described just above, the device structure disclosed herein is formed such that the layer (i.e., spacer layer), which is in contact with the active $Ga_{0.67}In_{0.3}N_{0.01}As_{0.99}$ well layer 146 as an active layer in the dielectric-stripe laser, contains none of, or less than the well layer 146 of Al.

Therefore, the construction of the dielectric-stripe laser device can be achieved, in which the well layer 146 is interposed between other layers such as those having a band gap energy larger than the well layer 146, without incorporating excessive N into the interfacing portion between the well layer and the spacer layer 145 (or 147) which is in contact with the well layer 146.

As a result, the aforementioned double-hetero structure is formed with excellent properties and device characteristics of the dielectric-stripe laser can further be improved.

A semiconductor light emitting device, in general, has to be constructed such that a light emitting layer is interposed between other layers which have band gap energies larger than the light emitting layer. Examples of the material for giving rise to the large band gap energy include, and are not limited to, AlGaAs, GaInP(As), AlGaInP, InP and AlGaInAs.

Therefore, a light emitting layer is often grown on top of an Al containing material which has a wide band gap energy, comprising a III–V semiconductor alloy and including N and other group-V elements. In such a case, the rate of N inclusion into the active layer increases to thereby result in the increase in the amount of N incorporated into the interface portion between the active layer and its neighboring layer with a rate larger than that into the active layer, and also result in a concomitant decrease in crystallinity.

As described above, the spacer layers 145, 147 are employed so as to contain none of, or less than the well layer 146 of Al and to be in contact directly with the active $Al_{0.03}Ga_{0.67}In_{0.3}N_{0.01}As_{0.99}$ well layer 146. In this embodiment, therefore, the incorporation of excessive N into the interfacing portion can be prevented and device characteristics of the dielectric-stripe laser can be further improved.

Although the growth method of the compositional layers for forming the dielectric-stripe laser was referred to the case with MOCVD, other methods may also be used alternatively such as MBE and other similar methods.

In addition, although the growth of the layers was described using DMHy as the N source material, other materials may be used alternatively such as activated N species, $NH_3$ and other appropriate N compounds.

Furthermore, although the structure of the active layer in the dielectric-stripe laser of the present example was referred to the case with a single quantum well (SQW), other structures may also be adopted, including such as, for example, a multi-guantum well (MQW) and double-hetero (DH) junctions.

Further still, the respective thicknesses of the compositional layers is not limited to that described above, but other thickness may be adopted for forming the laser structure, when relevant. In addition, laser structures may also appropriately be adopted other than those described above in the present embodiment.

Example 11

Figure 17:
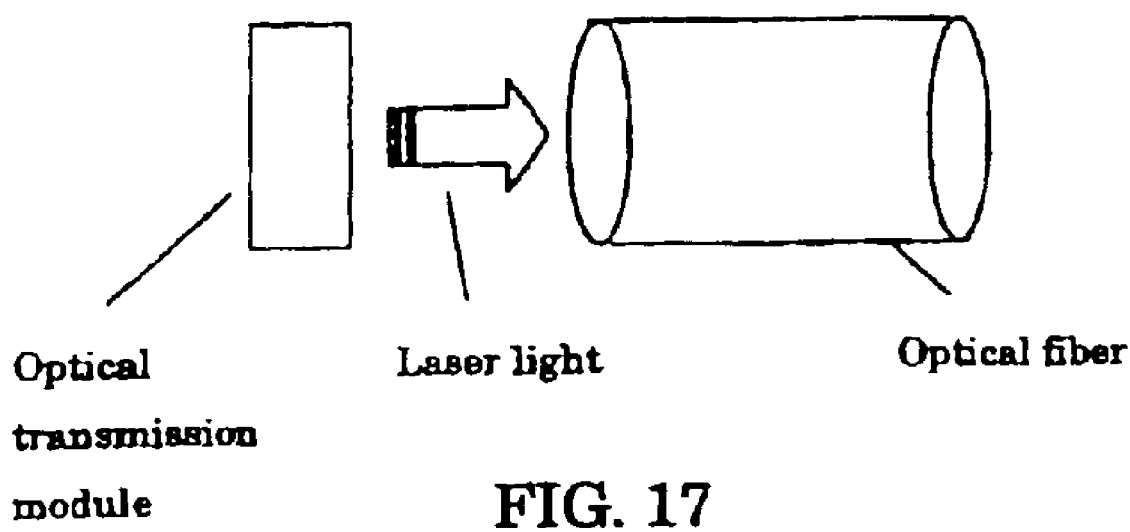
FIG. 17 is a diagram for describing an optical tansmission module.

An optical transmission module was constructed using the semiconductor laser device disclosed herein and an optical fiber, as illustrated in FIG. 17.

Optical signals are input from the semiconductor laser device to the optical fiber and subsequently transmitted. With a plurality of the semiconductor light emitting devices such as semiconductor lasers, having different emission wavelength and arranged in either in linear or two-dimensional array fashion, so as to constitute a multiple wavelength transmission module, the rate of the transmission can considerably be increased.

In addition, with a plurality of the devices such as semiconductor lasers, being arranged in either in linear or in two-dimensional array fashion to be appropriately coupled to a plurality of corresponding bundles of the optical fibers, the rate of the transmission again can considerably be increased.

By utilizing optical communication systems incorporating the semiconductor light emitting devices disclosed herein, this system can be fabricated to have advantages over known systems such as considerably improved temperature characteristics of the devices and reduced operating current, thereby being operable without a cooling device such as a peltier element or heat sink which has been conventionally attached to the system, among others.

As a result, less expensive optical communication systems become feasible by utilizing the semiconductor laser device combined with optical fibers.

Example 12

Figure 18:
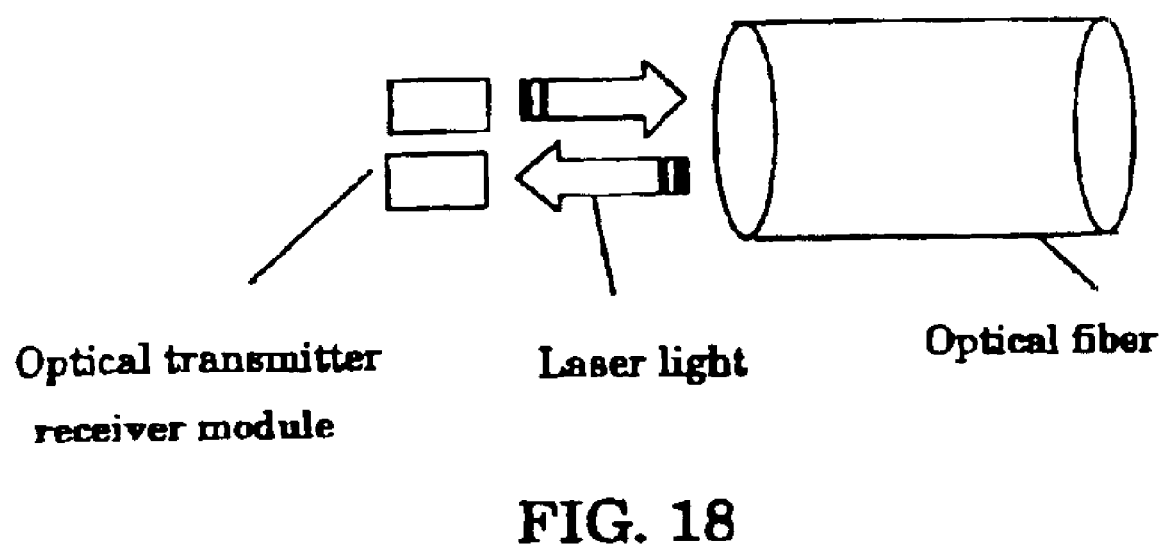
FIG. 18 is a diagram for describing an optical transmitter receiver module.

An optical transmitter receiver module was constructed as illustrated in FIG. 18 using the semiconductor laser and photodiode receptor device, disclosed herein, and an optical fiber.

By utilizing the semiconductor laser disclosed herein, an optical communication system can be fabricated, having advantages over known systems such as improved temperature characteristics of the devices and reduced operating current, thereby being operable without a cooling device which has been conventionally attached to the system, among others.

As a result, less expensive optical communication systems become feasible by utilizing the semiconductor laser and photodiode receptor devices, combined with optical fibers, as disclosed in the present example.

Optical communication systems incorporating the semiconductor laser devices disclosed herein can be utilized not only in the long distance transmission with optical fibers, but also in the transmission among computers and other similar devices via a local area network (LAN), and also as an optical interconnection means in other short distance communication areas such as, for example, data transmission among boards, CPUs, LSIs in the boards, and elements in LSIs.

While the processing operation speed by LSIs has increased recently, it has been realized that a further increase is bottle necked by insufficient transmission speed in the portion interconnecting the LSIs.

By using the optical interconnection, in place of the known electrical interconnection, a very high speed computer systems can be constructed. This may be achieved, as described above, by adopting the optical interconnection means incorporating the optical transmission module and transmitter receiver modules disclosed herein above.

In addition, by interconnecting a plurality of computer systems using the optical transmission module and transmitter receiver modules disclosed herein, a very high speed computer network systems can be constructed.

The surface emission type of laser device is known to be fabricated as a two-dimensional array with relative ease, being operable with current values of several order of magnitude smaller than that for edge emission type of laser devices, to thereby facilitate the application in the area of the parallel transmission type optical communication system.

Although emission wavelengths of the laser device for this application are preferably at the range of 1.3 micron and 1.55 micron, in which the transmission loss is relative low in the optical fibers, these favorable wavelengths have not been achieved by previously known laser devices.

According to the device fabrication disclosed here, GaInNAs layers can be grown on a GaAs substrate with excellent crystalline properties. As a result, since the well known techniques for fabricating surface emission type laser device can be utilized for the device formation on the GaAs substrate, surface emission type laser devices therefore become feasible having 1.3 micron and 1.55 micron range of laser emissions.

In particular, by incorporating the optical transmission modules and transmitter receiver modules fabricated by combining the thus prepared 1.3 micron and 1.55 micron range surface emission type of laser devices together with single mode optical fibers, excellent long distance optical transmission systems can be constructed. With these system, a higher speed and larger capacity can be achieved over the previously known similar systems which are formed using the 0.85 micron range surface emission laser devices combined with multi-mode optical fibers.

In addition, the light emitting devices in the present invention may be adopted not only to other light emitting devices such as semiconductor laser devices for use in light communication and optical writing, but also to light emitting diodes and photodiodes for use in the infrared wavelength region, and other electronic devices such as, for example, high electron mobility transistors, each having improved device characteristics.

This document claims priority and contains subject matter related to Japanese Patent Applications 10-249185, 10-286056, 10-333451 and 11-73497, filed with the Japanese Patent Office on Aug. 19, 1998, Sep. 22, 1998, Nov. 9, 1998 and Mar. 18, 1999, respectively, the entire contents of which are hereby incorporated by reference.

Although there have been described what are at present considered to be the preferred embodiments of the invention, it will be understood that the invention may be embodied in other specific forms without departing from the essential characteristic thereof. The present embodiments are therefore considered in all respect as illustrative, and not restrictive. This scope of the invention is indicated by the appended claims rather than by foregoing description.

What is claimed is:

1. An optical transmission module, including a semiconductor light emitting device, said semiconductor light emitting device comprising:

a semiconductor substrate;

an active region comprising a strained quantum well layer; and a cladding layer for confining carriers and light emissions, wherein an amount of lattice strains in said quantum well layer is in excess of 2% against either said semiconductor substrate or said cladding layer.

2. An optical transmitter receiver module, including a semiconductor light emitting device, said semiconductor light emitting device comprising:

a semiconductor substrate;

an active region comprising a strained quantum well layer; and a cladding layer for confining carriers and light emissions, wherein an amount of lattice strains in said quantum well layer is in excess of 2% against either said semiconductor substrate or said cladding layer.

3. An optical communication system, including a semiconductor light emitting device, said semiconductor light emitting device comprising:

a semiconductor substrate;

an active region comprising a strained quantum well layer; and a cladding layer for confining carriers and light emissions, wherein an amount of lattice strains in said quantum well layer is in excess of 2% against either said semiconductor substrate or said cladding layer.

4. The optical transmission module according to claim 1, wherein a thickness of said quantum well layer is in excess of a critical thickness calculated by a relationship of Matthews and Blakeslee.

5. The optical transmission module according to claim 1, wherein said semiconductor substrate is composed of GaAs.

6. The optical transmission module according to claim 1, wherein said strained quantum well layer is composed of $Ga_xIn_{1-x}N_yAs_{1-y}$ ($0 \leq x \leq 1$, $0 \leq y < 1$).

7. The optical transmission module according to claim 6, wherein said strained quantum well layer composed of $Ga_xIn_{1-x}N_yAs_{1-y}$ ($0 \leq x \leq 1$, $0 \leq y < 1$) is characterized to have a photoluminescence peak wavelength of at least 1.12 micron for GaInAs (y=0).

8. The optical transmission module according to claim 6, wherein the In content in said strained quantum well layer is at least 30% of group-III elements included therein.

9. The optical transmission module according to claim 6, wherein the N content in said strained quantum well layer is from 0% to 1% of group-V elements included therein.

10. The optical transmission module according to claim 1, wherein a plane orientation of said semiconductor substrate is in a (100) direction with an allowable deviation of at most 5°.

11. The optical transmission module according to claim 1, wherein said cladding layer is composed of either GaInP or GaInPAs.

12. The optical transmission module according to claim 1, further comprising a barrier layer provided in a vicinity of said strained quantum well layer to relax the strains therein.

13. The optical transmission module according to claim 1, wherein said semiconductor light emitting device is a surface emitting type device.

14. The optical transmission module according to claim 13, further comprising:

a first mirror region formed adjacent to said semiconductor substrate, a quantum well active region formed thereon, comprising said strained quantum well layer; and a second mirror region formed on an opposite side of said active region from said first mirror region, to collectively constitute an optical cavity for achieving stimulated light emissions, wherein at least said first mirror region is constructed to have a periodic multi-layered structure of thin semiconductor layers with alternating higher and lower refractive indices.

15. The optical transmission module according to claim 13, further comprising:

a first mirror region formed adjacent to said semiconductor substrate, a quantum well active region formed thereon, comprising said strained quantum well layer; and a second mirror region formed on an opposite side of said active region from said first mirror region, to collectively constitute an optical cavity for achieving stimulated light emissions, wherein at least said first mirror region is constructed to have a periodic multi-layered structure of thin semiconductor layers with alternating higher and lower refractive indices, in which said thin semiconductor layers are characterized as to contain no Al.

16. The optical transmission module according to claim 13, further comprising;

a first mirror region formed adjacent to said semiconductor substrate, a quantum well active region formed thereon, comprising said strained quantum well layer; and a second mirror region formed on an opposite side of said active region from said first mirror region, to collectively constitute an optical cavity for achieving stimulated light emissions, wherein at least said first mirror region is constructed to have a periodic multi-layered structure of thin dielectric layers with alternating higher and lower refractive indices.

17. The optical transmission module according to claim 1, wherein said strained quantum well layer is formed at temperatures of at most 600° C.

18. The optical transmission module according to claim 1, wherein said light emitting device comprises III–V alloy semiconductor layers formed by metal organic chemical vapor deposition (MOCVD) using organic compounds as the source material for the III-group elements.

19. The optical transmission module according to claim 1, wherein said strained quantum well layer is formed using nitrogen containing organic compounds selected from the group consisting of dimethylhydrazine and monomethylhydrazine.

20. The optical transmitter receiver module according to claim 2, wherein a thickness of said quantum well layer is in excess of a critical thickness calculated by a relationship of Matthews and Blakeslee.

21. The optical transmitter receiver module according to claim 2, wherein said semiconductor substrate is composed of GaAs.

22. The optical transmitter receiver module according to claim 2, wherein said strained quantum well layer is composed of $Ga_xIn_{1-x}N_yAs_{1-y}$ ($0 \leq x \leq 1$, $0 \leq y < 1$).

23. The optical transmitter receiver module according to claim 22, wherein said strained quantum well layer composed of $Ga_xIn_{1-x}N_yAs_{1-y}$ ($0 \leq x \leq 1$, $0 \leq y < 1$) is characterized to have a photoluminescence peak wavelength of at least 1.12 micron for GaInAs (y=0).

24. The optical transmitter receiver module according to claim 22, wherein the In content in said strained quantum well layer is at least 30% of group-III elements included therein.

25. The optical transmitter receiver module according to claim 22, wherein the N content in said strained quantum well layer is from 0% to 1% of group-V elements included therein.

26. The optical transmitter receiver module according to claim 2, wherein a plane orientation of said semiconductor substrate is in a (100) direction with an allowable deviation of at most 5°.

27. The optical transmitter receiver module according to claim 2 wherein said cladding layer is composed of either GaInP or GaInPAs.

28. The optical transmitter receiver module according to claim 2, further comprising a barrier layer provided in a vicinity of said strained quantum well layer to relax the strains therein.

29. The optical transmitter receiver module according to claim 2, wherein said semiconductor light emitting device is a surface emitting type device.

30. The optical transmitter receiver module according to claim 29, further comprising:
   a first mirror region formed adjacent to said semiconductor substrate, a quantum well active region formed thereon, comprising said strained quantum well layer; and
   a second mirror region formed on an opposite side of said active region from said first mirror region, to collectively constitute an optical cavity for achieving stimulated light emissions,
   wherein at least said first mirror region is constructed to have a periodic multi-layered structure of thin semiconductor layers with alternating higher and lower refractive indices.

31. The optical transmitter receiver module according to claim 29, further comprising:
   a first mirror region formed adjacent to said semiconductor substrate, a quantum well active region formed thereon, comprising said strained quantum well layer; and
   a second mirror region formed on an opposite side of said active region from said first mirror region, to collectively constitute an optical cavity for achieving stimulated light emissions,
   wherein at least said first mirror region is constructed to have a periodic multi-layered structure of thin semiconductor layers with alternating higher and lower refractive indices, in which said thin semiconductor layers are characterized as to contain no Al.

32. The optical transmitter receiver module according to claim 29, further comprising;
   a first mirror region formed adjacent to said semiconductor substrate, a quantum well active region formed thereon, comprising said strained quantum well layer; and
   a second mirror region formed on an opposite side of said active region from said first mirror region, to collectively constitute an optical cavity for achieving stimulated light emissions,
   wherein at least said first mirror region is constructed to have a periodic multi-layered structure of thin dielectric layers with alternating higher and lower refractive indices.

33. The optical transmitter receiver module according to claim 2, wherein said strained quantum well layer is formed at temperatures of at most 600° C.

34. The optical transmitter receiver module according to claim 2, wherein said light emitting device comprises III–V alloy semiconductor layers formed by metal organic chemical vapor deposition (MOCVD) using organic compounds as the source material for the III-group elements.

35. The optical transmitter receiver module according to claim 2, wherein said strained quantum well layer is formed using nitrogen containing organic compounds selected from the group consisting of dimethylhydrazine and monomethylhydrazine.

36. The optical communication system according to claim 3, wherein a thickness of said quantum well layer is in excess of a critical thickness calculated by a relationship of Matthews and Blakeslee.

37. The optical communication system according to claim 3, wherein said semiconductor substrate is composed of GaAs.

38. The optical communication system according to claim 3, wherein said strained quantum well layer is composed of $Ga_xIn_{1-x}N_yAs_{1-y}$ ($0 \leq x \leq 1$, $0 \leq y < 1$).

39. The optical communication system according to claim 38, wherein said strained quantum well layer composed of $Ga_xIn_{1-x}N_yAs_{1-y}$ ($0 \leq x \leq 1$, $0 \leq y < 1$) is characterized to have a photoluminescence peak wavelength of at least 1.12 micron for GaInAs (y=0).

40. The optical communication system according to claim 38, wherein the In content in said strained quantum well layer is at least 30% of group-III elements included therein.

41. The optical communication system according to claim 38, wherein the N content in said strained quantum well layer is from 0% to 1% of group-V elements included therein.

42. The optical communication system according to claim 3, wherein a plane orientation of said semiconductor substrate is in a (100) direction with an allowable deviation of at most 5°.

43. The optical communication system according to claim 3, wherein said cladding layer is composed of either GaInP or GaInPAs.

44. The optical communication system according to claim 3, further comprising a barrier layer provided in a vicinity of said strained quantum well layer to relax the strains therein.

45. The optical communication system according to claim 3, wherein said semiconductor light emitting device is a surface emitting type device.

46. The optical communication system according to claim 45, further comprising:
   a first mirror region formed adjacent to said semiconductor substrate, a quantum well active region formed thereon, comprising said strained quantum well layer; and
   a second mirror region formed on an opposite side of said active region from said first mirror region, to collectively constitute an optical cavity for achieving stimulated light emissions,
   wherein at least said first mirror region is constructed to have a periodic multi-layered structure of thin semiconductor layers with alternating higher and lower refractive indices.

47. The optical communication system according to claim 45, further comprising:
   a first mirror region formed adjacent to said semiconductor substrate, a quantum well active region formed thereon, comprising said strained quantum well layer; and
   a second mirror region formed on an opposite side of said active region from said first mirror region, to collectively constitute an optical cavity for achieving stimulated light emissions,
   wherein at least said first mirror region is constructed to have a periodic multi-layered structure of thin semiconductor layers with alternating higher and lower refractive indices, in which said thin semiconductor layers are characterized as to contain no Al.

48. The optical communication system according to claim 45, further comprising;
- a first mirror region formed adjacent to said semiconductor substrate, a quantum well active region formed thereon, comprising said strained quantum well layer; and
- a second mirror region formed on an opposite side of said active region from said first mirror region, to collectively constitute an optical cavity for achieving stimulated light emissions,
- wherein at least said first mirror region is constructed to have a periodic multi-layered structure of thin dielectric layers with alternating higher and lower refractive indices.

49. The optical communication system according to claim 3, wherein said strained quantum well layer is formed at temperatures of at most 600° C.

50. The optical communication system according to claim 3, wherein said light emitting device comprises III–V alloy semiconductor layers formed by metal organic chemical vapor deposition (MOCVD) using organic compounds as the source material for the III-group elements.

51. The optical communication system according to claim 3, wherein said strained quantum well layer is formed using nitrogen containing organic compounds selected from the group consisting of dimethylhydrazine and monomethylhydrazine.

* * * * *